(12) United States Patent
Sivakumar et al.

(10) Patent No.: US 9,973,215 B1
(45) Date of Patent: May 15, 2018

(54) CONTROLLED MULTIPATH DATA PACKET DELIVERY WITH FORWARD ERROR CORRECTION

(71) Applicant: EMC IP Holding Company LLC, Hopkinton, MA (US)

(72) Inventors: Raghupathy Sivakumar, Alpharetta, GA (US); Aravind Velayutham, Alpharetta, GA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 317 days.

(21) Appl. No.: 13/751,611

(22) Filed: Jan. 28, 2013

(51) Int. Cl.
*H03M 13/13* (2006.01)
(52) U.S. Cl.
CPC .................................. *H03M 13/13* (2013.01)
(58) Field of Classification Search
CPC .... H04L 1/0002; H04L 1/0006; H04L 1/0078
USPC .................................................. 714/779, 774
See application file for complete search history.

(56) References Cited

U.S. PATENT DOCUMENTS

| | | | |
|---|---|---|---|
| 6,792,518 B2 | 9/2004 | Armangau et al. | |
| 6,934,318 B2 * | 8/2005 | Sarkar | 375/141 |
| 7,054,883 B2 | 5/2006 | Meiri et al. | |
| 7,266,706 B2 | 9/2007 | Brown et al. | |
| 7,340,489 B2 | 3/2008 | Vishlitzky et al. | |
| 7,475,207 B2 | 1/2009 | Bromling et al. | |
| 7,558,926 B1 | 7/2009 | Oliveira et al. | |
| 7,577,722 B1 | 8/2009 | Khandekar et al. | |
| 7,613,890 B1 | 11/2009 | Meiri | |
| 7,840,595 B1 | 11/2010 | Blitzer et al. | |
| 7,975,018 B2 | 7/2011 | Unrau et al. | |
| 8,046,545 B2 | 10/2011 | Meiri et al. | |

(Continued)

FOREIGN PATENT DOCUMENTS

| | | |
|---|---|---|
| WO | WO 97/38549 | 10/1997 |
| WO | WO 01/95503 A1 | 12/2001 |

OTHER PUBLICATIONS

Kurant, M., Exploiting the Path Propagation Time Differences in Multipath Transmission With FEC, Jan. 11, 2009, pp. 1-12.*

(Continued)

*Primary Examiner* — Mujtaba M Chaudry
(74) *Attorney, Agent, or Firm* — Muirhead and Saturnelli, LLC

(57) ABSTRACT

The system described herein provides for the use of FEC in connection with mulithoming/multipathing functionality in a system leveraging multiple pathways and/or access circuits for packet delivery in a data network. In an appliance using multipathing, sophisticated path characterization, scheduling, and sequencing algorithms are used to support path aggregation independent of the heterogeneity in path characteristics. Adding FEC to a controlled multipathing solution may reduce the perceived loss rate, contribute to better performance in terms of delay and throughput, and provide for a more effective use of FEC. A multipathing solution splits network traffic at the packet level according to network and connection conditions. FEC may be added to the packets in connection with transmission of the packets along the multiple paths and the level/amount of the FEC coding may be controlled based on the ratio of the rate at which the packets are split among the multiple paths.

20 Claims, 17 Drawing Sheets

(56) References Cited

U.S. PATENT DOCUMENTS

| | | | |
|---|---|---|---|
| 8,185,795 B1 | 5/2012 | Krigovski et al. | |
| 8,335,899 B1* | 12/2012 | Meiri et al. | |
| 8,392,800 B2* | 3/2013 | Etkin | 714/774 |
| 2001/0028520 A1* | 10/2001 | Amada et al. | 360/39 |
| 2005/0022097 A1* | 1/2005 | Cheng | 714/774 |
| 2012/0230104 A1* | 9/2012 | Kim et al. | 365/185.03 |

OTHER PUBLICATIONS

EMC Corporation, "Deploying EMC RAPIDPath with EMC VPLEX Metro IP and VPLEX Geo," White paper h11293, 2011-2012, 19 pp.
U.S. Appl. No. 12/932,080, filed Feb. 17, 2011, Meiri et al.
U.S. Appl. No. 13/136,359, filed Jul. 29, 2011, Van Der Goot.
RFC 5510, "Reed-Solomon Forward Error Correction (FEC) Schemes," Lacan et al., Apr. 2009, 29 pp.
Versfeld et al., "A Reed-Solomon decoding algorithm for correcting bursts of erasures in real-time data in packet switched networks," IEEE, ITW2003, Paris, France, Mar. 31-Apr. 4, 2003, pp. 58-61.
Rizzo, Luigi, "Effective Erasure Codes for Reliable Computer Communication Protocols," ACM SIGCOMM Computer Communication Review, vol. 27, Issue 2, Apr. 1997, pp. 24-36.
Hamkins, Jon, "Optimal Codes for Burst Erasure Channel," IPN Progress Report 42-174, Aug. 15, 2008, 17 pp.
Kurant, M., "Exploiting the Path Propagation Time Differences in Multipath Transmission with FEC," IEEE INFOCOM Apr. 2009, 12 pp.

* cited by examiner

CONTROLLED MULTIPATH DATA PACKET DELIVERY WITH FORWARD ERROR CORRECTION

TECHNICAL FIELD

This application is related to the field of data transmission and, more particularly, to error correction in a data network environment.

BACKGROUND OF THE INVENTION

In current storage networks, and particularly storage networks including geographically distributed directors (or nodes) and storage resources, preserving or reducing bandwidth between resources and directors while providing optimized data availability and access is highly desirable. Data access may be localized, in part, to improve access speed to pages requested by host devices. Caching pages at directors provides localization, however, it is desirable that the cached data be kept coherent with respect to modifications at other directors that may be caching the same data. An example of a system for providing distributed cache coherence is described in U.S. Pat. No. 7,975,018 to Unrau et al., entitled "Systems and Methods for Providing Distributed Cache Coherency," which is incorporated herein by reference. Other systems and techniques for managing and sharing storage array functions among multiple storage groups in a storage network are described, for example, in U.S. Pat. No. 7,266,706 to Brown et al. entitled "Methods and Systems for Implementing Shared Disk Array Management Functions," which is incorporated herein by reference.

Data transfer among storage devices, including transfers for data replication or mirroring functions, may involve various data synchronization processing and techniques to provide reliable protection copies of data among a source site and a destination site. In synchronous transfers, data may be transmitted to a remote site and an acknowledgement of a successful write is transmitted synchronously with the completion thereof. In asynchronous transfers, a data transfer process may be initiated and a data write may be acknowledged before the data is actually transferred to directors at the remote site. Asynchronous transfers may occur in connection with sites located geographically distant from each other. Asynchronous distances may be distances in which asynchronous transfers are used because synchronous transfers would take more time than is preferable or desired. Particularly for asynchronous transfers, it is desirable to maintain a proper ordering of writes such that any errors or failures that occur during data transfer may be properly identified and addressed such that, for example, incomplete data writes be reversed or rolled back to a consistent data state as necessary.

Reference is made, for example, to U.S. Pat. No. 7,475,207 to Bromling et al. entitled "Maintaining Write Order Fidelity on a Multi-Writer System," which is incorporated herein by reference, that discusses features for maintaining write order fidelity (WOF) in an active/active system in which a plurality of directors (i.e. controllers and/or access nodes) at geographically separate sites can concurrently read and/or write data in a distributed data system. Discussions of data ordering techniques for synchronous and asynchronous data replication processing for other types of systems, including types of remote data facility (RDF) systems produced by EMC Corporation of Hopkinton, Mass., may be found, for example, in U.S. Pat. No. 7,613,890 to Meiri, entitled "Consistent Replication Across Multiple Storage Devices," U.S. Pat. No. 7,054,883 to Meiri et al., entitled "Virtual Ordered Writes for Multiple Storage Devices," and U.S. Pat. No. 8,335,899 to Meiri et al., entitled "Active/Active Remote Synchronous Mirroring," which are all incorporated herein by reference.

For security and reliability, among other reasons, a company may maintain a remote backup data site to provide a data back-up and/or data mirroring facility in the event of loss of data at a primary site due to a disaster. In anticipation of the possibility of a catastrophic disaster, such as a natural disaster, it may be desirable to situate the remote backup site far from the primary site. An example of a storage system that may provide data backup and mirroring capability over a long distances is the Symmetrix Remote Data Facility (SRDF) products provided by EMC Corporation of Hopkinton, Mass. The SRDF system may be implemented using long haul networks that provide for reliable data links over large distances.

For a long haul network, data may be transmitted using protocols that enable the connection, communication and data transfer between computing end-points. For example, TCP/IP links allow applications to communicate reliably over IP packet networks. TCP/IP is a two-layer program. The higher layer, TCP, manages the assembling of a message or file into smaller packets that are transmitted over the Internet and received by a TCP layer that reassembles the packets into the original message. The lower layer, IP, handles the address part of each packet so that the packet is transmitted to the right destination. Each packet may include a checksum, which is a form of redundancy check in which data bits of the packet are added and the resulting value communicated to a receiver. If processing of the packet at a receiver detects an incorrect checksum, the receiver may conclude that the received packet contains errors and request that the transmitter retransmit the packet and/or may request that the transmitter retransmit from a certain byte offset in the stream.

TCP/IP links permit sharing of network bandwidth access connections using congestion-avoidance algorithms. One congestion-avoidance algorithm may be a window-adjustment algorithm that allows a TCP sender to dynamically adjust a transmission window that represents the maximum amount of unacknowledged data that may be in transit in the network at any given time. Window size may be calculated as bandwidth times the round trip delay or latency. In an acknowledgement scheme in which the receiver sends an acknowledge of received packets to the sender, it may take at least one roundtrip time for each packet to be acknowledged. Thus, a TCP sender can safely send up to a window's worth of packets every round trip time. In a long-haul network, the roundtrip time may be high, thereby yielding a reduced sending rate, which may drop even further if the window size is reduced or if dynamic adjustments to the window are made in a suboptimal fashion.

Congestion events may cause a significant reduction in the size of the transmission window. For example, in response to detection of congestion, TCP may cut the window size in half according to a window adjustment algorithm. Other technologies developed in connection with TCP window adjustment algorithms, include, for example, high speed TCP and variants thereof, which provide for the dynamic altering of how the window is opened on each round trip and closed on congestion events in a way that is dependent upon the absolute size of the window.

Long-haul TCP/IP links may be susceptible to packet loss and/or delay that may significantly reduce data transmission throughput. As discussed above, in the event of error detection using checksum, a receiver may request retransmission of a packet. However, in a long haul network, retransmission of packets may cause both latency and bandwidth issues resulting from long roundtrip times and decreased transmission window sizes. Accordingly, error correction techniques may be used to address these issues. Error correction may be performed using forward error correction (FEC) which is a system of error control for data transmission in which the sender adds redundant data to its messages, also known as an error correction code. FEC allows the receiver to detect and correct errors (to at least some extent) without the need to ask the sender for additional data. FEC involves adding redundancy to transmitted information using a predetermined algorithm. Each redundant bit may be a complex function of many original information bits. Two main categories of FEC are block coding and convolutional coding. Block codes work on packets of predetermined size. Convolutional codes work on data streams of arbitrary length. Convolutional codes may be decoded with the Viterbi algorithm, among other algorithms. Block codes may include, for example, Reed-Solomon, Golay, BCH and Hamming codes, among others. A convolutional code may be turned into a block code.

In FEC, a back-channel is not required and retransmission of data may be avoided, which may be desirable in situations in which retransmission is costly and/or difficult. However, the cost of FEC may be higher bandwidth requirements to account for the transmission of the redundant data. In long haul TCP/IP links having a fixed transmission window size and relatively long round trip times, increased bandwidth requirements may significantly affect sending rates and data throughput. In addition, FEC algorithms that require both the sender and the receiver to be running the same algorithm lack flexibility.

Accordingly, it would be desirable to provide a system for error correction that provides for data reliability while improving data transmission throughput in a data network environment.

SUMMARY OF THE INVENTION

According to the system described herein, a method for error correction processing includes determining a plurality of pathways in a data network environment for transmission of a plurality of data packets from a transmitting device to a destination device. Packet rates for the transmission of each of the plurality of data packets are allocated for each of the plurality of pathways. Correction packets are generated corresponding to each of the plurality of data packets for transmission to the destination device. The correction packets each include a level of forward error correction encoding. The level of forward error correction encoding for the correction packets depends on the packet rates for the transmission of the plurality of data packets for each of the plurality of pathways. The correction packets may be transmitted to the destination device over the plurality of pathways. At least some of the correction packets may be received and decoded at the destination device to generate the plurality of data packets. The correction packets may be transmitted to the destination device via a communications link that supports TCP/IP communication between the destination device and the transmitting device. Connection conditions may be determined between the transmitting device and the destination device for the plurality of pathways. Each of the transmitting device and the destination device may include a multipathing appliance that performs the error correction processing. Allocating the packet rates for the transmission of each of the plurality of data packets for each of the plurality of pathways may include determining packet transmission rates and packet loss rates over the plurality of pathways. The forward error correction encoding may use Reed Solomon coding.

According further to the system described herein, a non-transitory computer readable medium storing software for error correction processing. The software includes executable code that determines a plurality of pathways in a data network environment for transmission of a plurality of data packets from a transmitting device to a destination device. Executable code is provided that allocates packet rates for the transmission of each of the plurality of data packets for each of the plurality of pathways. Executable code is provided that generates correction packets corresponding to each of the plurality of data packets for transmission to the destination device, wherein the correction packets each include a level of forward error correction encoding, wherein the level of forward error correction encoding for the correction packets depends on the packet rates for the transmission of the plurality of data packets for each of the plurality of pathways. Executable code may be provided that transmits the correction packets to the destination device. Executable code may be provided that receives at least some of the correction packets at the destination device. Executable code is provided that decodes the at least some of the correction packets to generate the plurality of data packets. The correction packets may be transmitted to the destination device via a communications link that supports TCP/IP communication between the destination device and the transmitting device. Executable code may be provided that determines connection conditions between the transmitting device and the destination device for the plurality of pathways. The executable code that allocates the packet rates for the transmission of each of the plurality of data packets for each of the plurality of pathways may include executable code that determines packet transmission rates and packet loss rates over the plurality of pathways.

According further to the system described herein, a system for error correction processing includes a device that is coupled to a network, the device including a processor and a computer-readable medium that stores software executable by the processor. The software includes executable code that determines a plurality of pathways in a data network environment for transmission of a plurality of data packets from a transmitting device to a destination device. Executable code is provided that allocates packet rates for the transmission of each of the plurality of data packets for each of the plurality of pathways. Executable code is provided that generates correction packets corresponding to each of the plurality of data packets for transmission to the destination device, wherein the correction packets each include a level of forward error correction encoding, wherein the level of forward error correction encoding for the correction packets depends on the packet rates for the transmission of the plurality of data packets for each of the plurality of pathways. Executable code may be provided that transmits the correction packets to the destination device. Executable code may be provided that receives at least some of the correction packets at the destination device. Executable code is provided that decodes the at least some of the correction packets to generate the plurality of data packets. The correction packets may be transmitted to the destination device via a communications link that supports TCP/IP communication between the destination device and the transmitting device. Executable code may be provided that determines connection conditions between the transmitting device and the destination device for the plurality of pathways. The executable code that allocates the packet rates for the transmission of each of the plurality of data packets for each of the plurality of pathways may include executable code that determines packet transmission rates and packet loss rates over the plurality of pathways.

BRIEF DESCRIPTION OF THE DRAWINGS

Embodiments of the system described herein are explained in detail with reference to the several figures of the drawings, which are briefly described as follows.

DETAILED DESCRIPTION OF VARIOUS EMBODIMENTS

Figure 1:
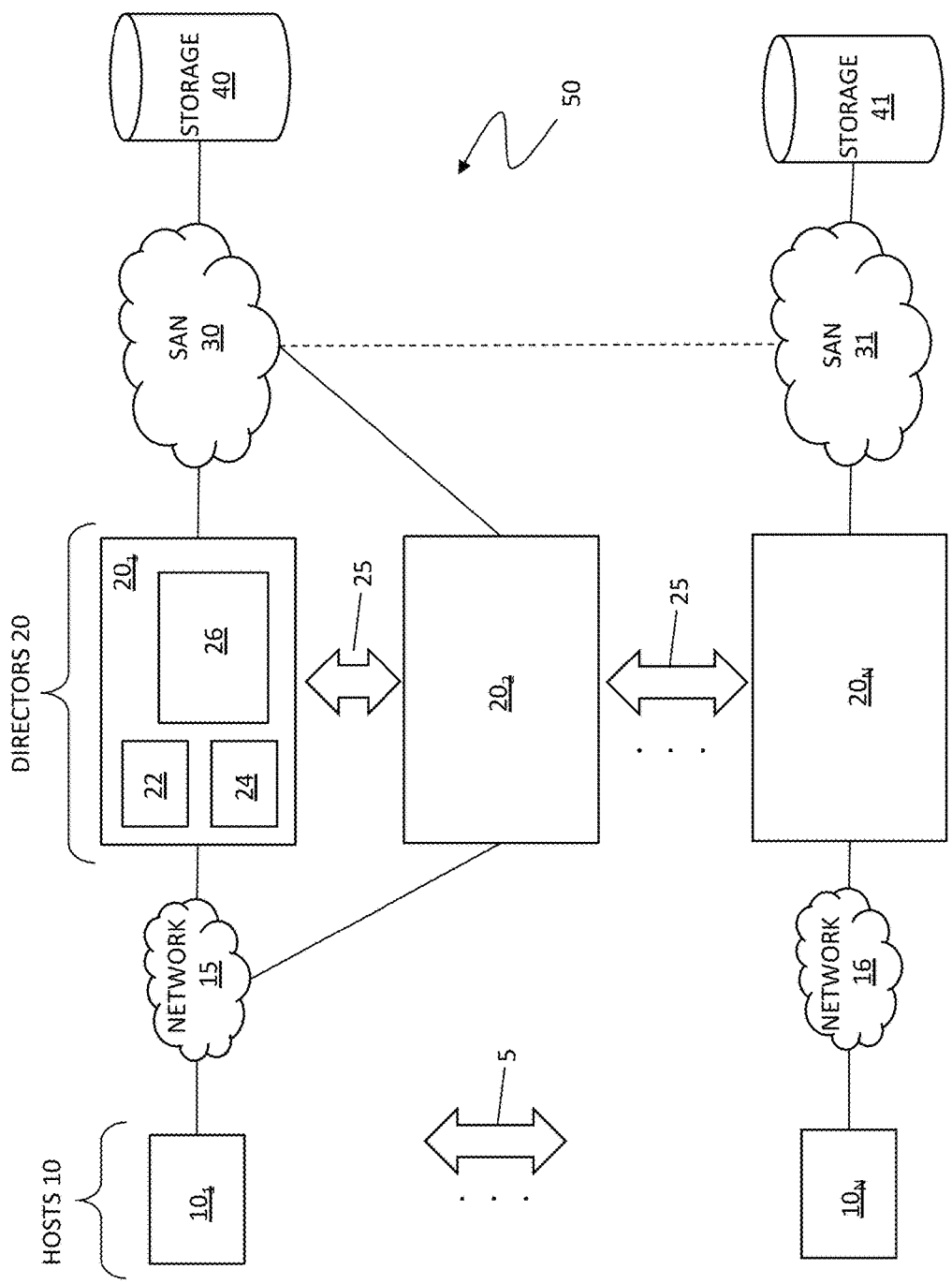
FIG. 1 shows a network configuration of a distributed storage system that may be used in accordance with an embodiment of the system described herein.

FIG. 1 shows a network configuration of a distributed storage system 50 that may be used in accordance with an embodiment of the system described herein. As shown, a plurality of host devices 10 ($10_1$ to $10_N$) are communicably coupled with a plurality of directors 20 ($20_1$, $20_2$ to $20_N$). Each of the directors 20 may include a processor (CPU) component 22, such as a microprocessor or other intelligence module, a cache component 24 (e.g., RAM cache), an instance of a distributed cache manager 26 and/or other local storage and communication ports. In general, "N" is used herein to indicate an indefinite plurality, so that the number "N" when referred to one component does not necessarily equal the number "N" of a different component. For example, the number of hosts 10 may or may not equal the number of directors 20 in FIG. 1. Cache memory may generally be considered memory that is faster and more easily accessible by a processor than other non-cache memory used by a device.

Each of the hosts 10 may be communicably coupled to one or more of directors 20 over one or more network connections 15, 16. It is noted that host devices 10 may be operatively coupled with directors 20 over any of a number of connection schemes as required for the specific application and geographical location relative to each of the directors 20, including, for example, a direct wired or wireless connection, an Internet connection, a local area network (LAN) connection, a wide area network (WAN) connection, a VLAN, a proprietary network connection, a Fibre channel (FC) network etc. Furthermore, hosts may also be coupled to one another via the networks 15, 16 and/or operationally via a different network 5 and several of the hosts 10 may be clustered together at one or more sites in which the sites are geographically distant from one another. It is also noted that in various embodiments the networks 15, 16 may be combined with the SAN networks 30, 31.

Each of the directors 20 may also include, or be communicably coupled with, one or more file systems, such as a virtual machine file system (VMFS), a new technology file system (NTFS) and/or other appropriate file system, and may be communicably coupled with one or multiple storage resources 40, 41, each including one or more disk drives and/or other storage volumes, over one or more storage area networks (SAN) 30, 31, and/or other appropriate network, such as a LAN, WAN, etc. The directors 20 may be located in close physical proximity to each other, and/or one or more may be remotely located, e.g., geographically remote, from other directors, as further discussed elsewhere herein. It is possible for the SANs 30, 31 to be coupled together, and/or for embodiments of the system described herein to operate on the same SAN, as illustrated by a dashed line between the SAN 30 and the SAN 31. Each of the directors 20 may also be able to intercommunicate with other directors over a network 25, such as a public or private network, a peripheral component interconnected (PCI) bus, a Fibre Channel (FC) network, an Ethernet network and/or an InfiniBand network, among other appropriate networks. In other embodiments, the directors may also be able to communicate over the SANs 30, 31 and/or over the networks 15, 16. Several of the directors 20 may be clustered together at one or more sites and in which the sites are geographically distant from one another. The system described herein may be used in connection with a VPLEX product produced by EMC Corporation of Hopkinton, Mass. and/or a vSphere product produced by VMware Inc. of Palo Alto, Calif. The system described herein may also be used in connection with an storage product produced by EMC Corporation, such as a Symmetrix product. Although principally discussed and illustrated in connection with embodiment for a distributed storage system, the system described herein may generally be used in connection with any appropriate distributed processing system.

Each distributed cache manager 26 may be responsible for providing coherence mechanisms for shared data across a distributed set of directors. In general, the distributed cache manager 26 may include a module with software executing on a processor or other intelligence module (e.g., ASIC) in a director. The distributed cache manager 26 may be implemented in a single director or distributed across multiple intercommunicating directors. In certain aspects, each of the directors 20 may be embodied as a controller device, or blade, communicably coupled to one or more of the SANs 30, 31 that allows access to data stored on the storage networks. However, it may be appreciated that a director may also be embodied as an intelligent fabric switch, a hub adapter and/or other appropriate network device and may also be implemented as a virtual machine, as further discussed elsewhere herein. In some cases, a suitable networked director may be configured to operate as an access node with distributed cache manager functionality. For example, a distributed cache manager may be run on one or more desktop computers and/or virtual machines with a network connection.

A distributed storage system may enable a storage device to be exported from multiple distributed directors, which may be either appliances or arrays, for example. In an active/active storage system, if there are multiple interfaces to a storage device, each of the interfaces may provide equal access to the storage device. With an active/active storage system, hosts in different locations may have simultaneous write access to mirrored exported storage device(s) through a local front-end thereof (i.e., a director). The distributed storage system may be responsible for providing globally consistent and coherent data access. The system described herein may be used in connection with enabling the distributed storage system to meet consistency guarantees and maximize data access even in response to failures that may cause inconsistent data within the distributed storage system.

A virtual machine (VM) is a software implementation of a machine that executes programs like a physical machine. Virtualization software allows multiple VMs with separate operating systems to run in isolation on the same physical server. Each VM may have its own set of virtual hardware (e.g., RAM, CPU, NIC, etc.) upon which an operating system and applications are loaded. The operating system may see a consistent, normalized set of hardware regardless of the actual physical hardware components. The virtual center may operate to control virtual machines in data centers and, for example, in connection with cloud computing. The virtual center may further include a virtual data center that provides logical control and management of data storage in a data center, and provides for sub-dividing contents of virtual components into compute resources, network resources and storage resources.

A number of virtualization software products exist, including the VMware product family provided by VMware, Inc. of Palo Alto, Calif. A benefit of providing VMs is the ability to host multiple, unrelated, clients in a single physical server. The virtualization software may maintain separation of each of the clients, and in which each of the clients separately access their own virtual server(s). Other virtualization products that may be used in connection with the system described herein include Hyper-V by Microsoft Corporation of Redmond, Wash., public license virtualization products and/or other appropriate virtualization software.

Configuring and deploying VMs is known in the field of computer science. For example, U.S. Pat. No. 7,577,722 to Khandekar, et al., entitled "Provisioning of Computer Systems Using Virtual Machines," which is incorporated herein by reference, discloses techniques for configuring and deploying a VM according to user specifications. VMs may be provisioned with respect to any appropriate resource, including, for example, storage resources, CPU processing resources and/or memory. Operations of VMs may include using virtual machine images. A VM image may be a point-in-time image or snapshot of the state of the virtual machine as it resides in the host's memory. The VM image may be obtained for an operating VM and transferred to another location where the VM continues execution from the state defined by the virtual machine image. In this way, the VM image may be a snapshot of an execution state of a program by a VM that may be moved between different locations and processing thereafter continued without interruption. Reference is made to U.S. patent application Ser. No. 12/932,080 to Meiri et al., filed Feb. 17, 2011, entitled "VM Mobility Over Distance," and U.S. patent application Ser. No. 13/136,359 to Van Der Goot, filed Jul. 29, 2011, entitled "Active/Active Storage and Virtual Machine Mobility Over Asynchronous Distances," which are incorporated herein by reference.

In a virtualized environment, a centralized management infrastructure, that may be referred to as a virtual center, may provide a central point of control for managing, monitoring, provisioning and migrating virtual machines. Virtual centers may operate to control virtual machines in data centers and, for example, in connection with cloud computing. A virtual center may further include a virtual data center that provides logical control and management of data storage in a data center. A virtual center may be used in connection with an infrastructure platform that provides an integrated package of components to provide network, compute and/or storage services for use in a virtualized environment. One example of an infrastructure platform is a Vblock product produced by VCE Company, LLC of Richardson, Tex. It is noted that the term "Vblock" used herein may also be generally understood as including and referring to any appropriate software and/or component packages of a converged infrastructure product that provides network, compute and/or storage services for use in a virtualized computing environment. For example, other suitable types of converged infrastructure products may include EMC Corporation's VMAX SP and/or VSPEX products. Management of a Vblock and/or other appropriate type of converged infrastructure product may be provided by an appropriate software element. For example, EMC's Ionix Unified Infrastructure Manager (UIM) may be integrated with Vblock and provide a management console for management of the Vblock package.

Figure 2:
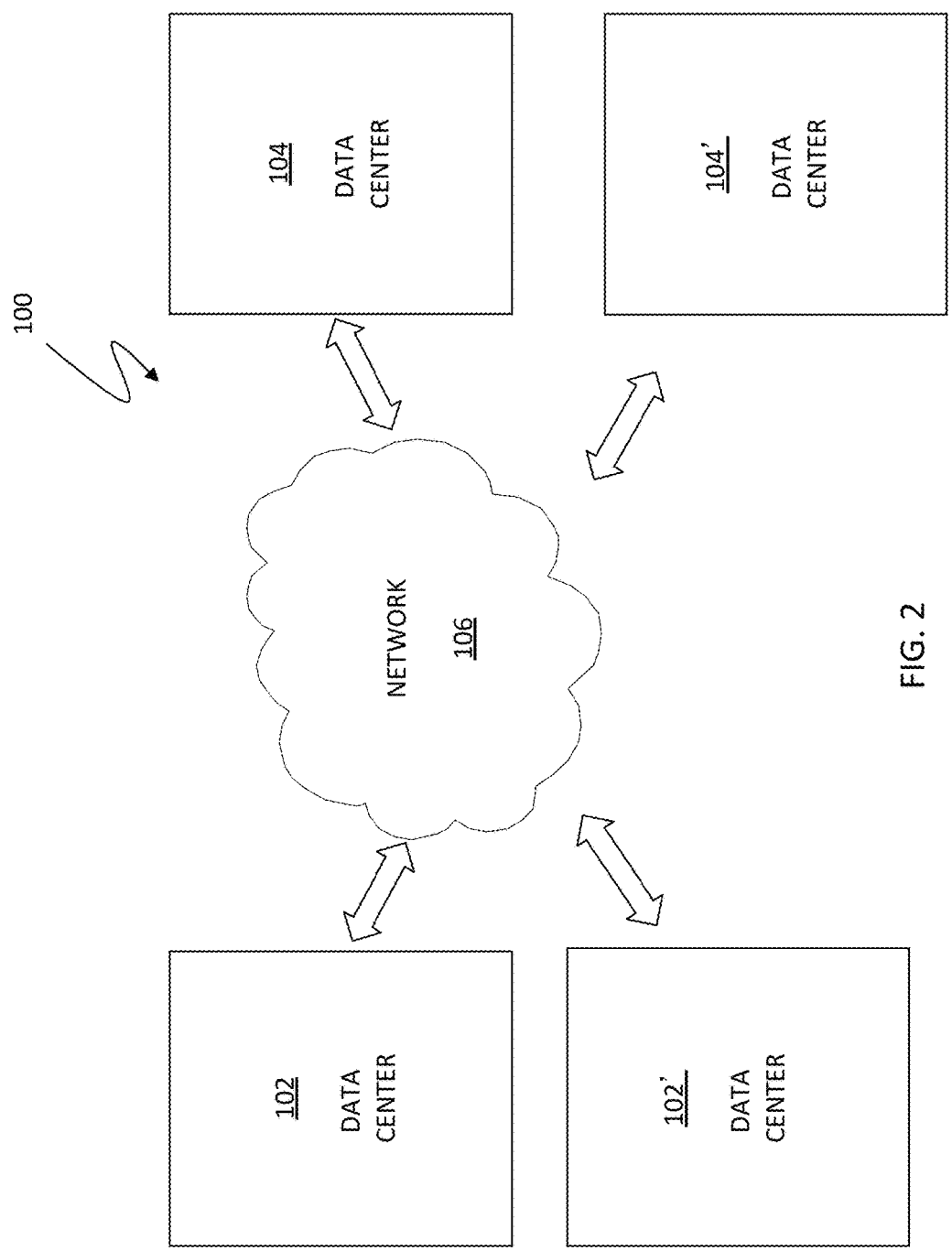
FIG. 2 is a schematic illustration showing a system that includes a plurality of data centers in communication via a network that may be used in accordance with an embodiment of the system described herein.

FIG. 2 is a schematic illustration showing a system 100 that includes a first data center 102 in communication with a second data center 104 via a network 106. Although the following embodiments are discussed principally in connection with data centers 102, 104 any number of additional data centers, represented as data centers 102', 104', may be also be used in connection with the system described herein. Each of the data centers 102, 104 may include a plurality of storage devices and processors (not shown in FIG. 2) for executing applications using a plurality of VMs and which may be controlled and/or managed in connection with one or more virtual centers and virtual data centers. The VMs may be configured using any appropriate server virtualization technology, such as that provided by VMware, Inc. of Palo Alto, Calif., including vSphere. VSphere is a suite of tools/applications offering the ability to perform cloud computing utilizing enterprise-level virtualization products such as VMware's ESX and/or ESXi. VSphere allows multiple VMs to run on any ESX host. Other VM technology may be used including any appropriate VM technology provided by other vendors.

The data centers 102, 104 may contain any number of processors and storage devices that are configured to provide the functionality described herein. In an embodiment herein, the storage devices may be Symmetrix storage arrays provided by EMC Corporation of Hopkinton, Mass. Other appropriate types of storage devices and different types of processing devices may also be used in connection with the system described herein. The data centers 102, 104 may be configured similarly to each other or may be configured differently. The network 106 may be any network or similar mechanism allowing data communication between the data centers 102, 104. In an embodiment herein, the network 106 may be the Internet and/or any other appropriate network and each of the data centers 102, 104 may be coupled thereto using any appropriate mechanism. In other embodiments, the network 106 may represent a direct connection (e.g., a physical connection) between the data centers 102, 104.

In various embodiments, VMs may be migrated from a source one of the data centers 102, 104 to a destination one of the data centers 102, 104. VMs may be transferred from one data site to another, including VM mobility over geographical distances, for example, for reasons of disaster avoidance, load balancing and testing, among other reasons. For a discussion of migrating VMs, reference is made to U.S. patent application Ser. No. 12/932,080 to Meiri et al., filed Feb. 17, 2011, entitled "VM Mobility Over Distance," and U.S. patent application Ser. No. 13/136,359 to Van Der Goot, filed Jul. 29, 2011, entitled "Active/Active Storage and Virtual Machine Mobility Over Asynchronous Distances," which are incorporated herein by reference. A product, such as EMC's VPLEX Metro and/or VPLEX Geo, may be used to enable the resources of disparate storage systems in dispersed data centers to be federated and/or coordinated and utilized as a single pool of virtual storage. VPLEX allows for logical storage units (e.g., logical unit numbers (LUNs)), provisioned from various storage arrays, to be managed through a centralized management interface. Products like VPLEX Metro or Geo provide for data mobility, availability and collaboration through active/active data over synchronous and asynchronous distances with provide for the ability to non-disruptively move many VMs. It is noted that the term "VPLEX" used herein may also generally be understood to refer to and include any appropriate software and/or component packages that provide for coordinating and/or federating resources of disparate systems as a single pool of virtual resources, in particular, for example, a single pool of virtual storage.

Figure 3:
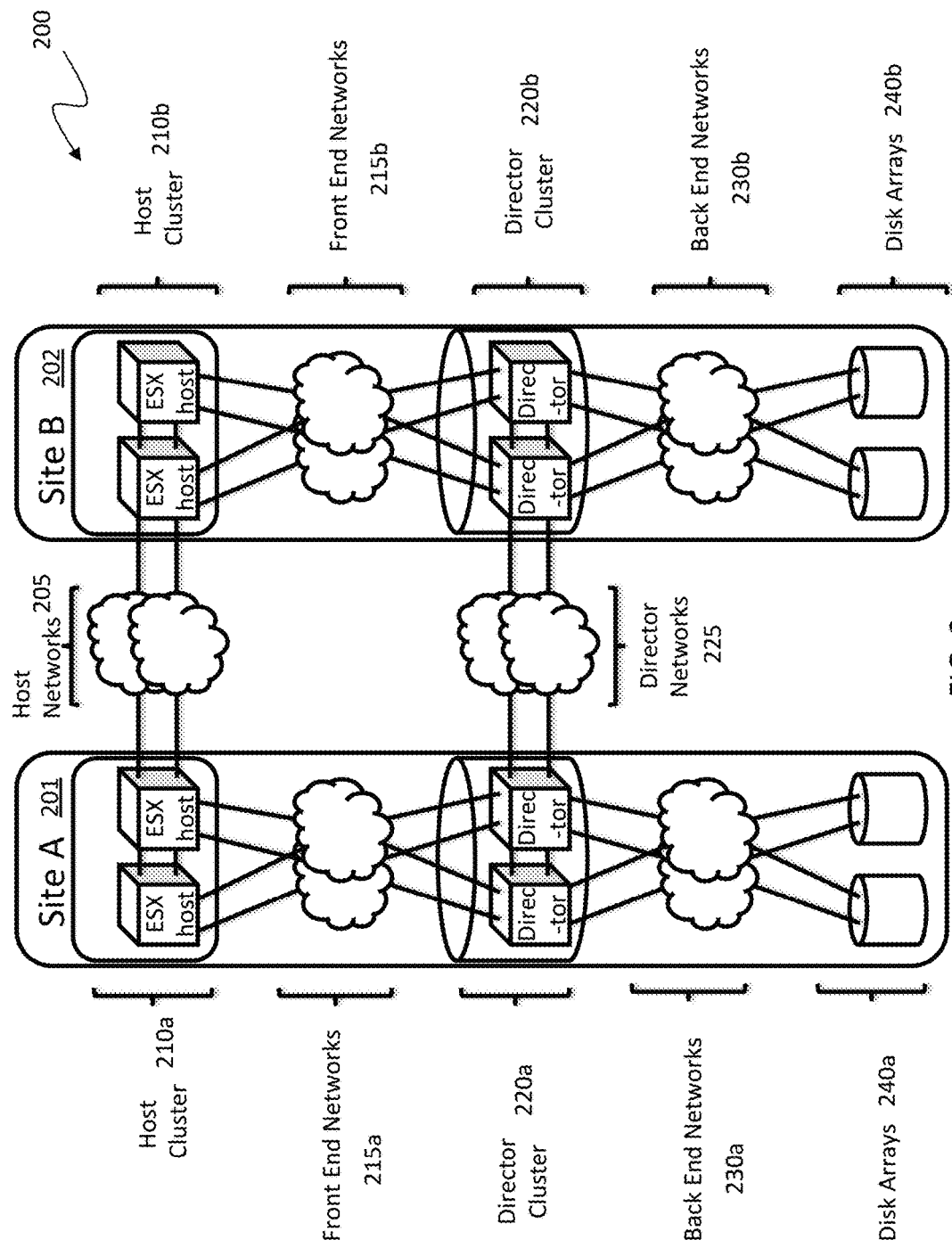
FIG. 3 is a schematic illustration showing a distributed storage system with multiple sites according to an embodiment of the system described herein.

FIG. 3 is a schematic illustration showing a distributed storage system 200 having multiple sites according to an embodiment of the system described herein. Although illustrated with two sites, Site A 201 and Site B 202, the system described herein may also operate in connection with additional sites. Although components are specifically identified with respect to Site A 201, Site B 202 (or any additional site) may also include the components discussed herein. The sites 201, 202 may include one or more hosts grouped in host clusters 210a,b, one or more directors grouped in director clusters 220a,b, and disk arrays 240a,b. Each host cluster 210a,b and director cluster 220a,b may each include software and/or other controllers or interfaces to control or administer operations in connection with described functions of the hosts and directors. In an embodiment, each host cluster 210a,b may include hosts, such as ESX hosts, in a vSphere cluster and each director cluster 220a,b may include directors in a VPLEX cluster. It is noted that although ESX hosts and illustrated and discussed herein as examples, any appropriate host may be used in connection with the system described herein. Front end networks 215a,b may connect through host links to the host clusters 210a,b and through front end links to the director clusters 220a,b. One or more back end networks 230a,b may connect through back end links to the director clusters 220a,b and through array links to the disk arrays 240a,b. In an embodiment, the front and back end networks may be Fibre Channel networks. The front end networks 215a,b allow the hosts (or VMs running therein) to perform I/O operations with the host clusters 210a,b, while the back end networks 230a,b allow the directors of the director clusters 220a,b to perform I/O on the disk arrays 240a,b. One or more host networks 205, such as vSphere Ethernet networks, connect the ESX hosts in host clusters 210a,b. One or more director networks 225 connect the directors of the director clusters 220a,b.

Various types of failures, including network failures within a cluster, may result in behaviors that are further discussed elsewhere herein. It should be noted that the host cluster 210a,b (e.g., vSphere cluster) may be connected in such a way that VMs can keep their network (e.g., IP, FC, IB) addresses when migrating between clusters (for example, by means of a vLan or an open vSwitch). In an embodiment, VPLEX may be used and configured to expose one or more distributed volumes from both VPLEX director clusters. A VMFS may be created on top of these distributed volumes allowing VMs that migrate between the sites to see the same file system in either site. It is also noted that, as illustrated and according to various embodiments, each site 201, 202 may include redundancies in hosts, directors and links therebetween.

In some embodiments, the system described herein may be used in connection with a first set of one or more data centers that are relatively active (primary data centers) and a second set of one or more data centers that are relatively inactive (failover data centers). The first set of data centers and second set of data centers may both be used for application reading and writing, but the first set of data centers may be more active and/or include more response time sensitive applications than the second set of data centers. Each of the relatively active data centers in the first set of data centers may use at least one corresponding data center in the second set of data centers for failover operations. It should also be noted that in addition to the active/active system described herein, the system described herein may also be used in active/passive functioning as appropriate or desired.

I/O access may be provided to distributed volumes in an active/active system with two sites separated by an asynchronous latency. For asynchronous operation, a write operation to cluster at a remote site may be acknowledged as soon as a protection copy is made within the cluster.

Sometime later the write data is synchronized to the remote site. Similarly, writes to the remote site are later synchronized to a cluster at the local site. Software or other controllers at the director clusters, such as VPLEX, may present the same image of the data on either cluster to provide a cache-coherent view of the data. In an embodiment, this may be achieved by fetching data that has not yet been replicated between a source and destination site (i.e. "dirty" data; as compared with "clean" data which has been copied and is protected on multiple sites) over the inter-cluster link on an as needed basis. In the background, the controller (VPLEX) may synchronize the dirty data between the clusters.

The above operations may work as long as the inter-cluster network is available. If the inter-cluster link fails, both clusters may contain dirty data that is unknown by the respective remote clusters. As a consequence of this failure, the director cluster may roll-back the image of the data to a write order consistent point. In other words, the director cluster may roll-back the image of the data to a point where it knows the data that is available on both clusters, or to a time where the write data was exchanged between both sites. The director cluster may also guarantee roll-back to an image of the disk or volume that is write order consistent, which means that if the data of a specific write is available on the volume, all data of writes that were acknowledged before ("preceded") that write should be present too. Write order consistency is a feature that allows databases to recover by inspecting the volume image. Known techniques may provide write order consistency by grouping writes in what are called deltas and providing the consistency on a delta boundary basis. Reference is made to U.S. Pat. No. 7,475,207 to Bromling et al., entitled "Maintaining Write Order Fidelity on a Multi-Writer System," that discloses a system for maintaining write order fidelity (WOF) for totally active storage system implementations using WOF groups and including application to features such as point-in-time snapshots and continuous data protection, and to U.S. Pat. No. 7,054,883 to Meiri et al., entitled "Virtual Ordered Writes for Multiple Storage Devices," that discloses features for ordering data writes among groups of storage devices. The above-noted references are incorporated herein by reference.

Suspend/resume migration processing may involve suspending a VM in the source site and resuming that VM in the destination site. Before the suspended VM is resumed, all dirty data for the affected VMFS may be synchronized from the source VPLEX cluster to the destination VPLEX cluster, and the preference (i.e. "winner" site) for the distributed volume may be changed from the source cluster to the destination cluster. The preference attribute may be related to a VPLEX consistency group that contains one or more VMs. Hence, the VM may be in a consistency group of its own or all VMs in a consistency group may be migrated together. To know when the synchronization of VPLEX's dirty cache is finished, the customer may map the VMFS to a distributed volume.

Failures may also occur when a VM is migrated while performing I/O operations. In an example, the migration of a VM during I/O operations may be referred to herein as "vMotion" and may be facilitated by a VMware product called vMotion. In a director network failure situation during VM migration, both the source cluster directors and the destination cluster directors may contain dirty data. A similar problem may occur when multiple VMs have to be migrated together because they all access one VMFS volume. In an embodiment, this problem could be alleviated by suspending the restart of the VM on the destination cluster until the director cluster (e.g., VPLEX cluster) cache has been synchronized; however, such operation may cause undesirable delays. For further detailed discussion of specific system behaviors in connection with different types of failure scenarios, reference is made to U.S. patent application Ser. No. 13/136,359 to Van Der Goot, filed Jul. 29, 2011, entitled "Active/Active Storage and Virtual Machine Mobility Over Asynchronous Distances," which is incorporated herein by reference.

Figure 4:
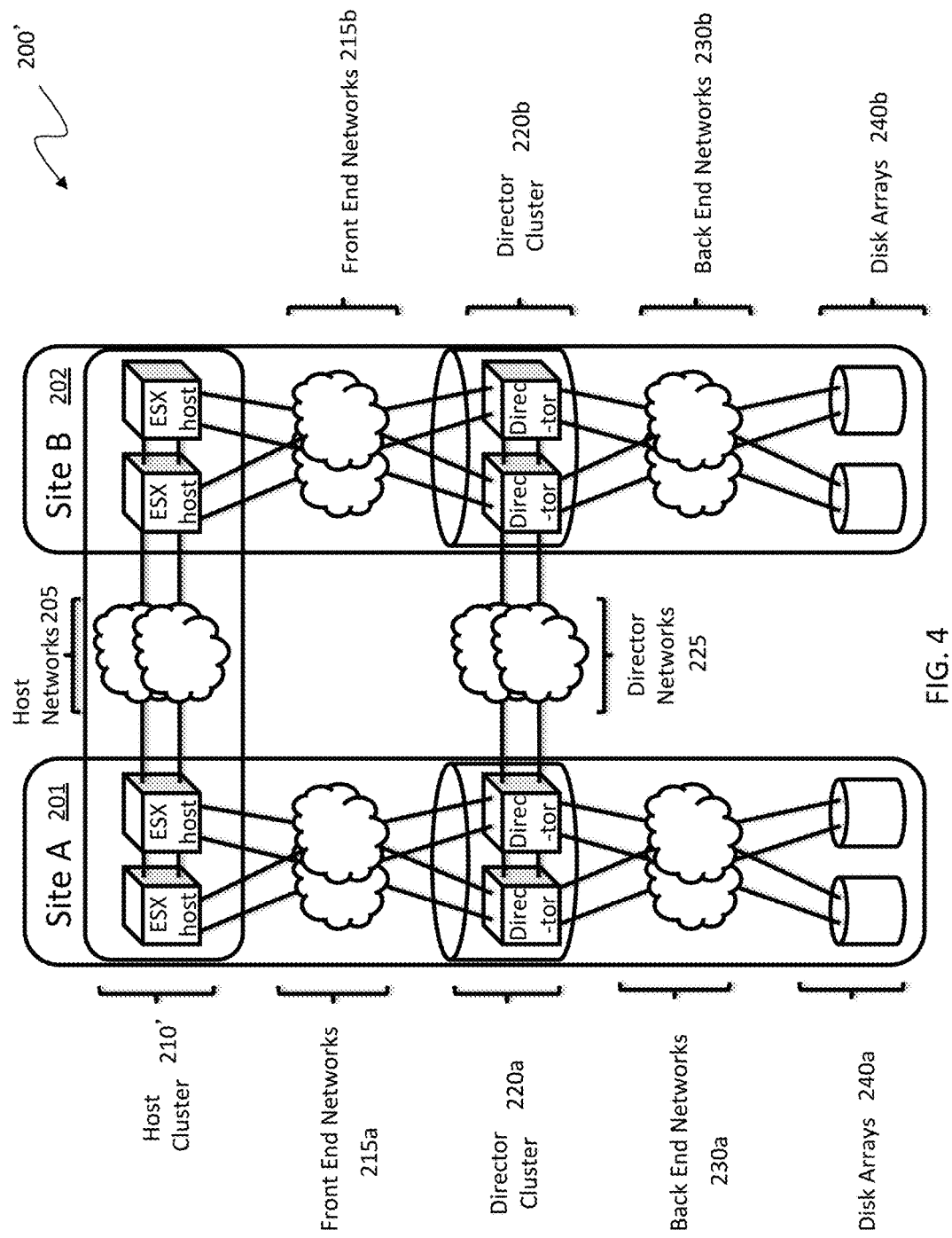
FIGS. 4 and 5 show alternative configurations of distributed storage systems that may be used in accordance with embodiments of the system described herein.
Figure 5:
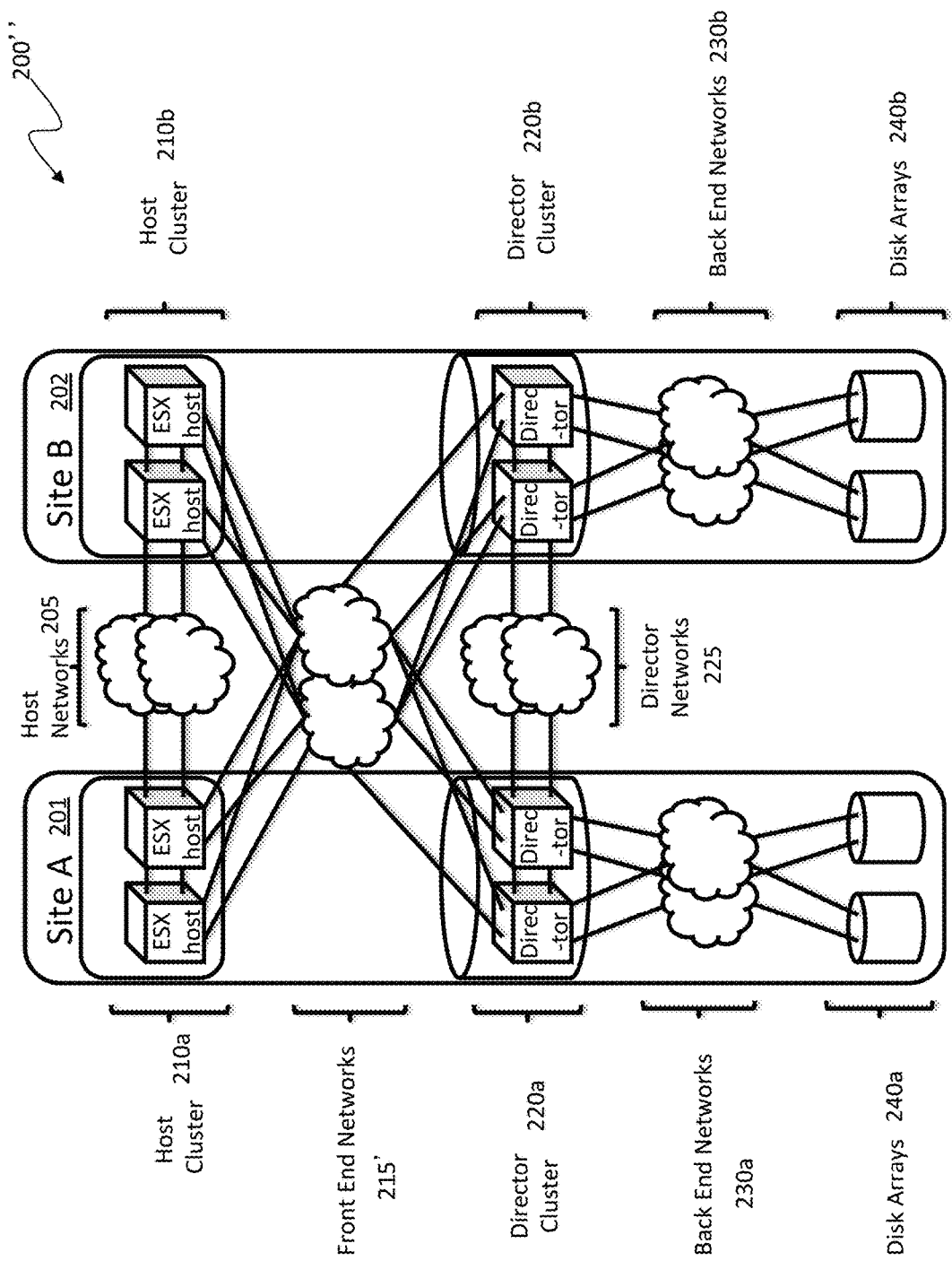

FIGS. 4 and 5 show alternative configurations for distributed storage systems that may be used in accordance with embodiments of the system described herein. In FIG. 4, a distributed storage system 200' is shown that includes a host cluster 210' as a distributed processing layer operating across the multiple sites 201, 202 and otherwise having elements like that discussed elsewhere herein. In FIG. 5, a distributed storage system 200" is shown in which the front end networks 215' are shown operating as an external network accessed by each of the sites 201, 202 and otherwise having elements like that discussed elsewhere herein.

Figure 6:
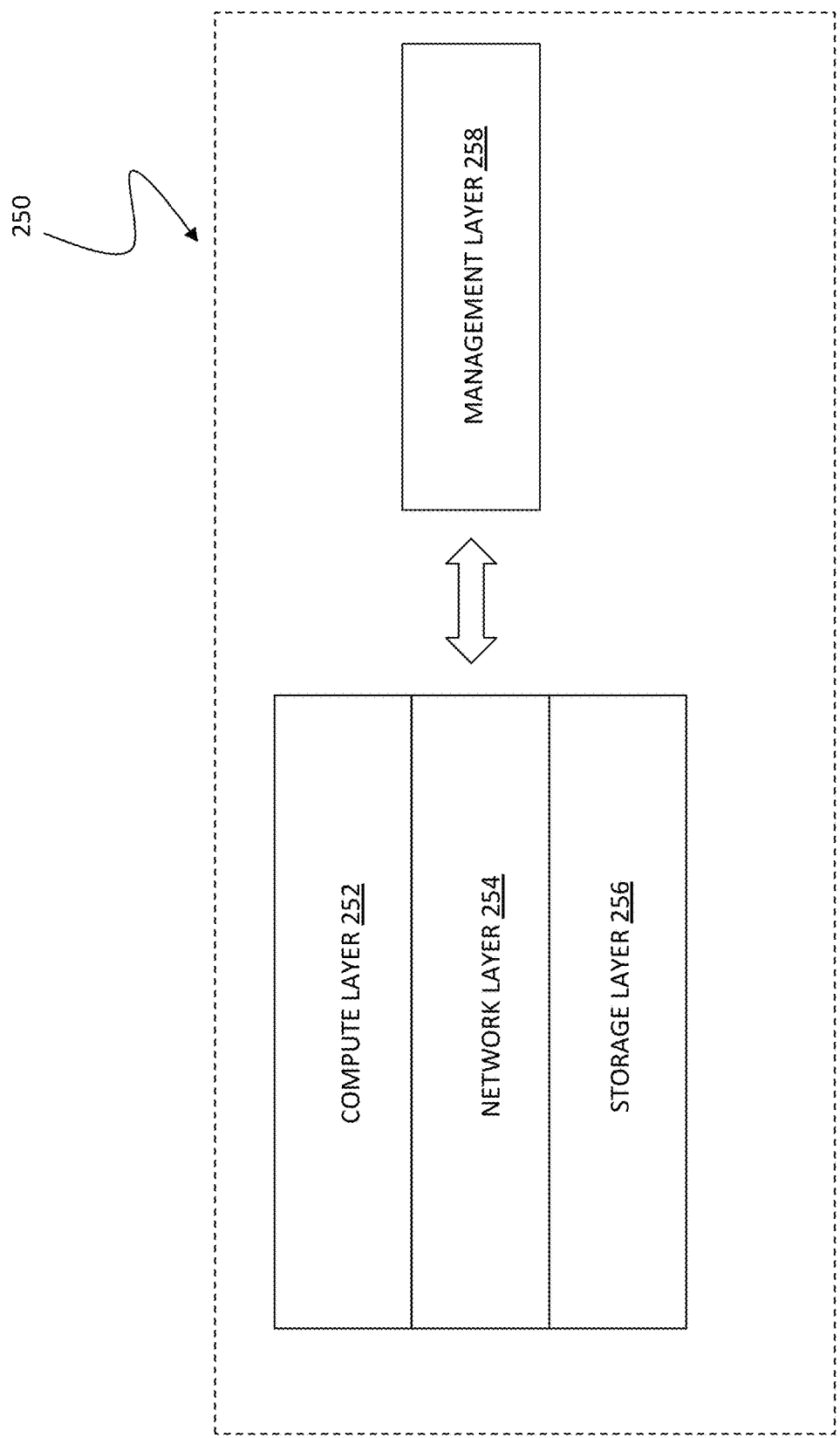
FIG. 6 shows an exemplary cloud computing system that may be used in connection with various embodiments of the system described herein in a manner similar to that discussed herein in connection with other types of distributed processing systems.

FIG. 6 shows an exemplary cloud computing system 250 that may be used in connection with various embodiments of the system described herein in a manner similar to that discussed herein in connection with other types of distributed processing systems. The system 250 may include a compute layer 252, a network layer 254, a storage layer 256 and/or a management layer 258. The system 250 may be understood as providing a cloud computing environment or platform that may be used in connection with cloud storage and/or other appropriate cloud processing applications. The layers 252, 254, 256 and 258 may be coupled together via one or more appropriate networks. In various embodiments, the compute layer 252 may include components, such as blade servers, chassis and fabric interconnects that provide the computing power for the cloud computing system. The storage layer 256 may include the storage components for the cloud computing system, such as one or more storage products produced by EMC Corporation. The network layer 254 may include one or more components that provide switching and routing between the compute 252 and storage 256 layers within systems and/or between multiple cloud computing systems and to the client or customer network. The management layer 258 may provide one or more components used to manage one or more of the layers 252, 254 and/or 256. In an embodiment, the management layer 258 may include EMC Corporation's Unified Infrastructure Manager (UIM).

Figure 7:
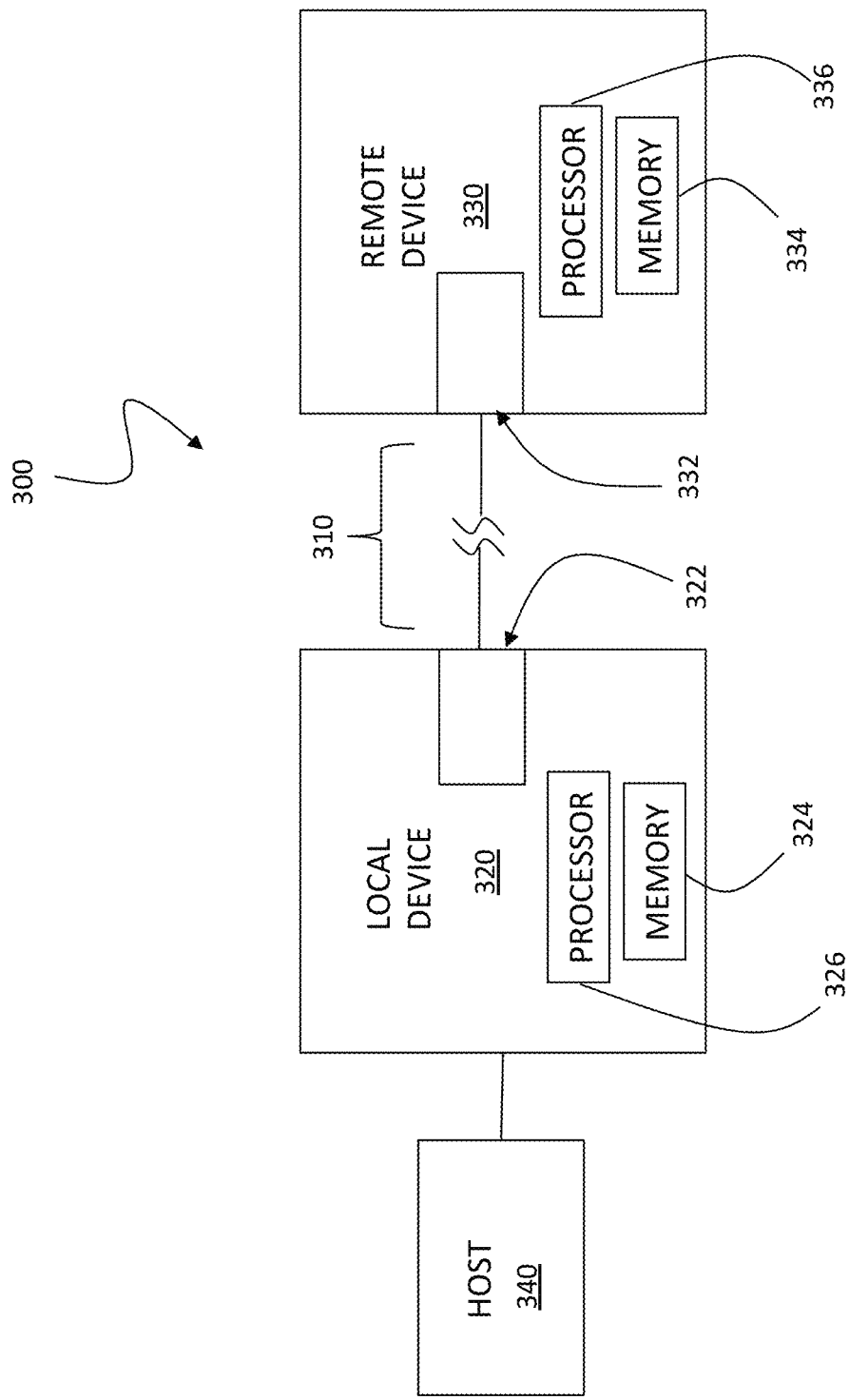
FIG. 7 is a schematic illustration showing a storage system including a local storage device coupled to a remote storage device via a link and which may be used in connection with the system described herein.

FIG. 7 is a schematic illustration showing a system 300 including a local device 320, coupled to a remote device 330 via a link 310 and which may be used in connection with the system described herein. The link 310 may be used in connection with multiple communication channels. In an embodiment, the link 310 may represent one or more TCP/IP links, including long-haul TCP/IP links, and may include a connection over a network, such as the Internet. Other appropriate types of communication links and transmission protocols may be used in connection with the system described herein. For example, wireless networks, fiber optic networks and corresponding transmission protocols may be used, among others. The local devices 320 and the remote device 330 may include hosts and/or one or more hosts 340 may be coupled to the local device 320 and/or to the remote device 330. The devices 320, 330 may each include a memory 324, 334 and one or more processors 326, 336, among other components, that may perform processes described herein including data receiving, transmitting, storing and/or error correction, as further discussed elsewhere herein. Each of the devices 320, 330 may include interconnects 322, 332 that represent components for the connection and interfacing of the devices 320, 330 to the link 310. The interconnects 322, 332 may include network sockets that interface the TCP/IP stack of the devices 320, 330. A network socket may include a protocol (e.g., TCP, User Datagram Protocol (UDP) and/or raw IP), a local IP address, a local port number, a remote IP address (for TCP sockets), and/or a remote port number (for TCP sockets). In an embodiment, the devices 320, 330 may operate as storage devices of a VPLEX and/or RDF product, such as provided by EMC Corporation of Hopkinton, Mass., for providing backup and/or mirroring of data.

It should be noted that although the devices 320, 330 are shown in similar configurations, each of the devices 320, 330 may be of different types and/or configurations in connection with various types of devices for transmitting and receiving data packets according to the system described herein. In an embodiment, for example, only one of the devices 320, 330 may include components for an error correction algorithm according to the system described herein. Further, processes discussed in connection with one of the devices may also apply to the other of the devices, for example the device 320 as a transmitting device and the device 330 as a destination device and/or the device 320 as a destination device and the device 330 as a transmitting device. Moreover, the system described herein provides for transmission of error correction packets separately from transmission of data packets, allowing for use of side-band communication of the correction packet without requiring a change to application code using TCP for communication, for example, no changes to software above the TCP socket level.

One or more of the interconnects 322, 332 may include an interface layer including a software layer, stored on a memory such as one the memories 324, 334 and/or other computer-readable medium, that is disposed between the TCP/IP stack and device drivers. The software layer may send and receive packets over one or more networks via the link 310. The packets sent and received may include data packets, overhead information and/or correction packets for providing error correction, among other data and information. In an embodiment, a correction packet may include an IP packet holding the XOR of N packets which may enable the rebuilding of the N packets in the event of data loss or corruption, as further discussed elsewhere herein. One and/or both of the devices 320, 330 may include components for generating a correction packet in connection with N packets and/or rebuilding a lost packet using a received correction packet, as further discussed elsewhere herein. For additional discussion of FEC correction packets, and system and techniques therefor, reference is made, for example, to U.S. Pat. No. 8,185,795 to Krigovski et al., entitled "Side Channel for Forward Error Correction Used with Long-Haul IP Links," which is incorporated herein by reference.

Figure 8:
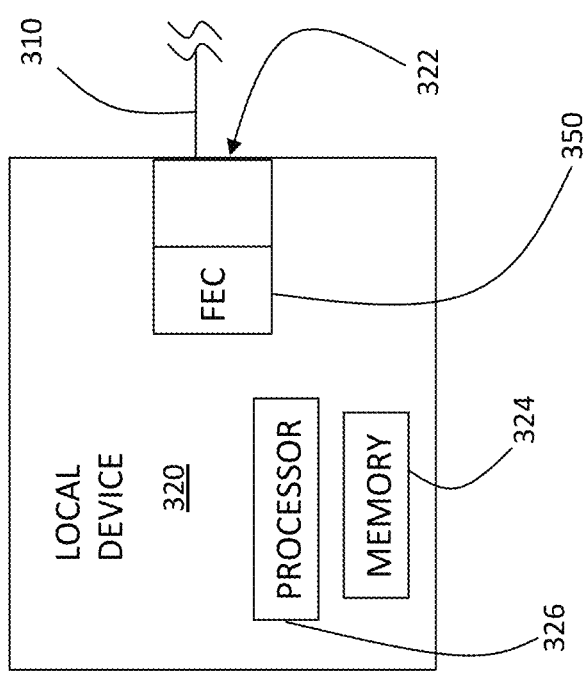
FIG. 8 is a schematic illustration showing the local device in which an FEC algorithm is included in an interface layer of the interconnect according to an embodiment of the system described herein.

FIG. 8 is a schematic illustration of the local device 320, including components discussed elsewhere herein, in which a forward error correction (FEC) algorithm for error correction processing using correction packets may be included as a software component 350 in an interface layer of the interconnect 322 according to an embodiment of the system described herein. The FEC algorithm may generate a correction packet for error correction processing and/or may rebuild lost packets, such as lost IP packets, using a received correction packet, as further discussed elsewhere herein according to the system described herein.

In other embodiments, the FEC algorithm may be part of an FEC coding/decoding device that is software stored elsewhere on one or more of the devices 320, 330 and/or the FEC coding/decoding device may be a separate device coupled to one of more of the devices 320, 330. As further discussed elsewhere herein, a level of FEC output and input processing may be controlled based on one or more rates of transmission of data packets.

Figure 9:
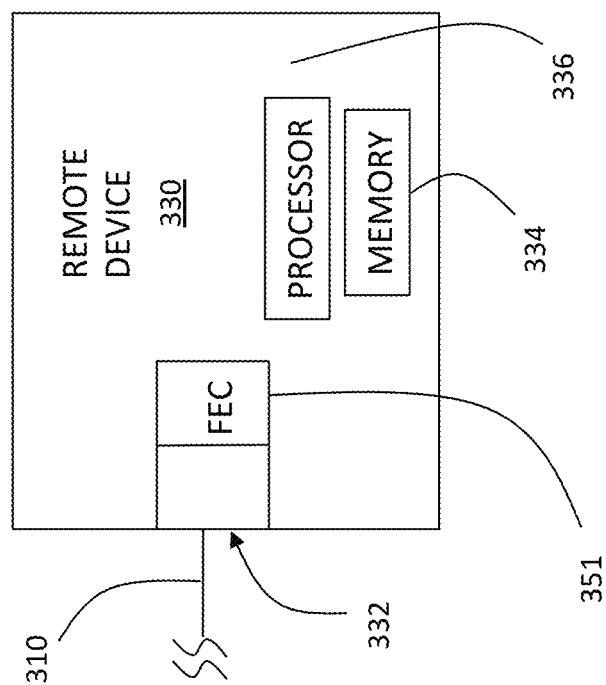
FIG. 9 is a schematic illustration showing the remote device in which an FEC algorithm is included in an interface layer of the interconnect according to an embodiment of the system described herein.

FIG. 9 is a schematic illustration of the local device 330, including components discussed elsewhere herein, including an FEC algorithm for error correction processing using correction packets shown as a software component 351 in an interface layer of the interconnect 332 according to an embodiment of the system described herein. The FEC algorithm may generate a correction packet for error correction processing and/or may rebuild lost packets, such as lost IP packets, using a received correction packet, as further discussed elsewhere herein. The FEC algorithm may be part of an FEC coding/decoding device that is software stored elsewhere on one or more of the devices 320, 330 and/or the FEC coding/decoding device may be a separate device coupled to one of more of the devices 320, 330.

The system described herein may be used and operation in connection with network traffic over public and private IP networks. In an embodiment, the system described herein may be used in connection with a RAPIDPath appliance by EMC Corporation of Hopkinton, Mass. RAPIDPath is an appliance that optimizes TCP and UDP(UDT) based network traffic between data centers. RAPIDPath allows for the intelligent management of traffic across multiple network paths based on network conditions and connections. The RAPIDPath appliance includes a collection of techniques that improve the performance of applications delivered over public and private IP networks. RAPIDPath is transparent to the other elements in the network, and is deployed on both sides of the WAN. Thus, RAPIDPath may be overlaid on existing network infrastructure without significant changes. The RAPIDPath appliance uses three main mechanisms: intelligent transport, TCP optimization and multihoming/multipathing. Intelligent transport provides for improved performance of WAN utilization. TCP Optimization provides for improved congestion control, reliability, and flow control of TCP connections. Multipathing leverages multiple pathways in a network and multihoming leverages multiple access circuits that might exist to provide connectivity.

Figure 10:
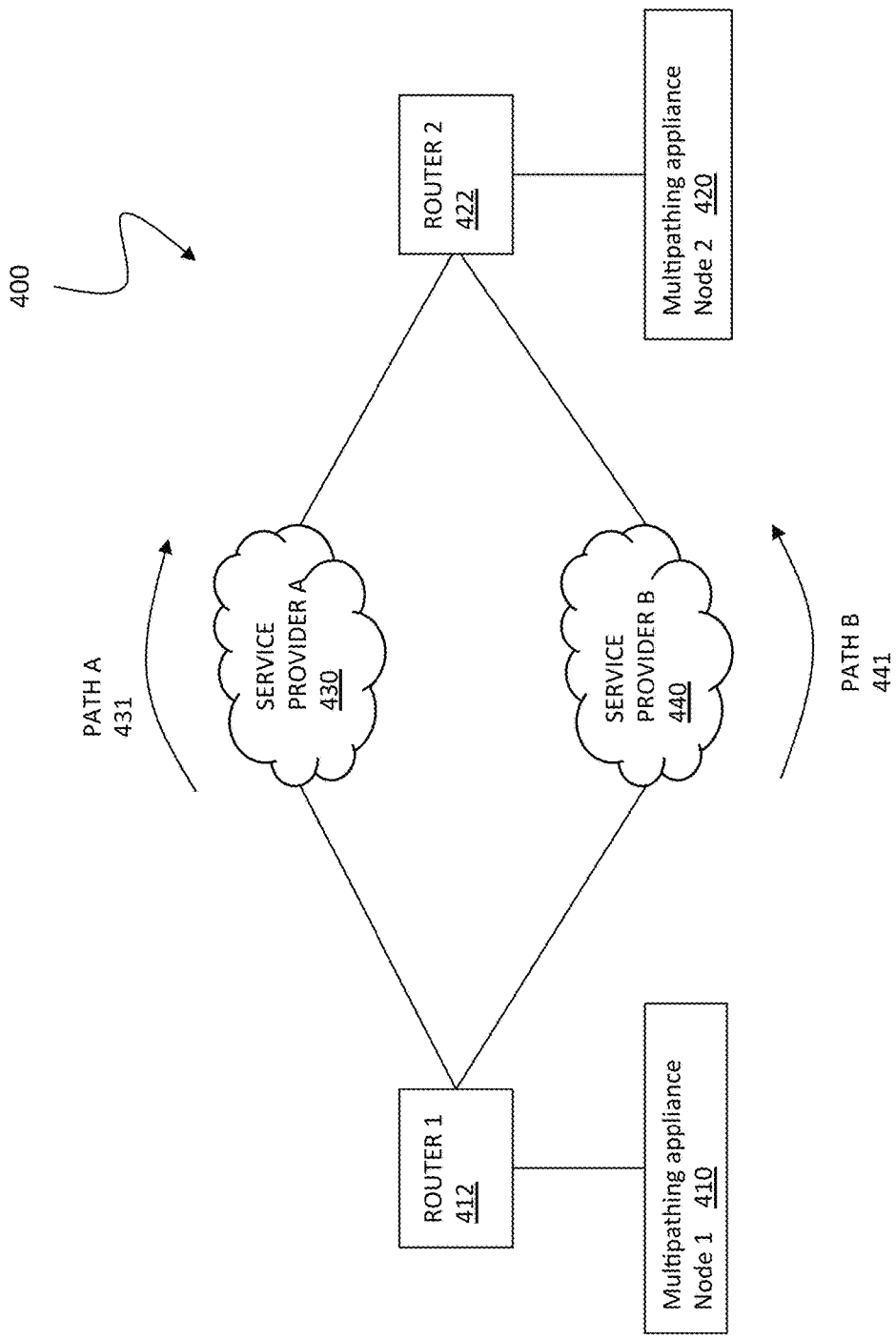
FIG. 10 is a schematic illustration of a multipathing system that may be used in connection with an embodiment of the system described herein.

FIG. 10 is a schematic illustration of a multipathing system 400 that may be used in connection with an embodiment of the system described herein. In an embodiment, the multipathing system 400 may be a RAPIDPath system architecture. The source and destination sites may include, as network nodes, a multipathing appliance, e.g., a RAPIDPath appliance, that is shown as multipathing appliance Node 1 410 and multipathing appliance Node 2 420. Two routers, Router 1 412 and Router 2 422, acts as routers/switches to transmit and receive data packets over the network according to the multipathing control provided by the multipathing appliances 410, 420. Two service providers, Service Provider A 430 and Service Provider B 440 as shown in connection with two illustrated paths, Path A 431 and Path B 441 through the network. Although two paths are shown, the system described herein may operate in connection with more than two paths.

Figure 11:
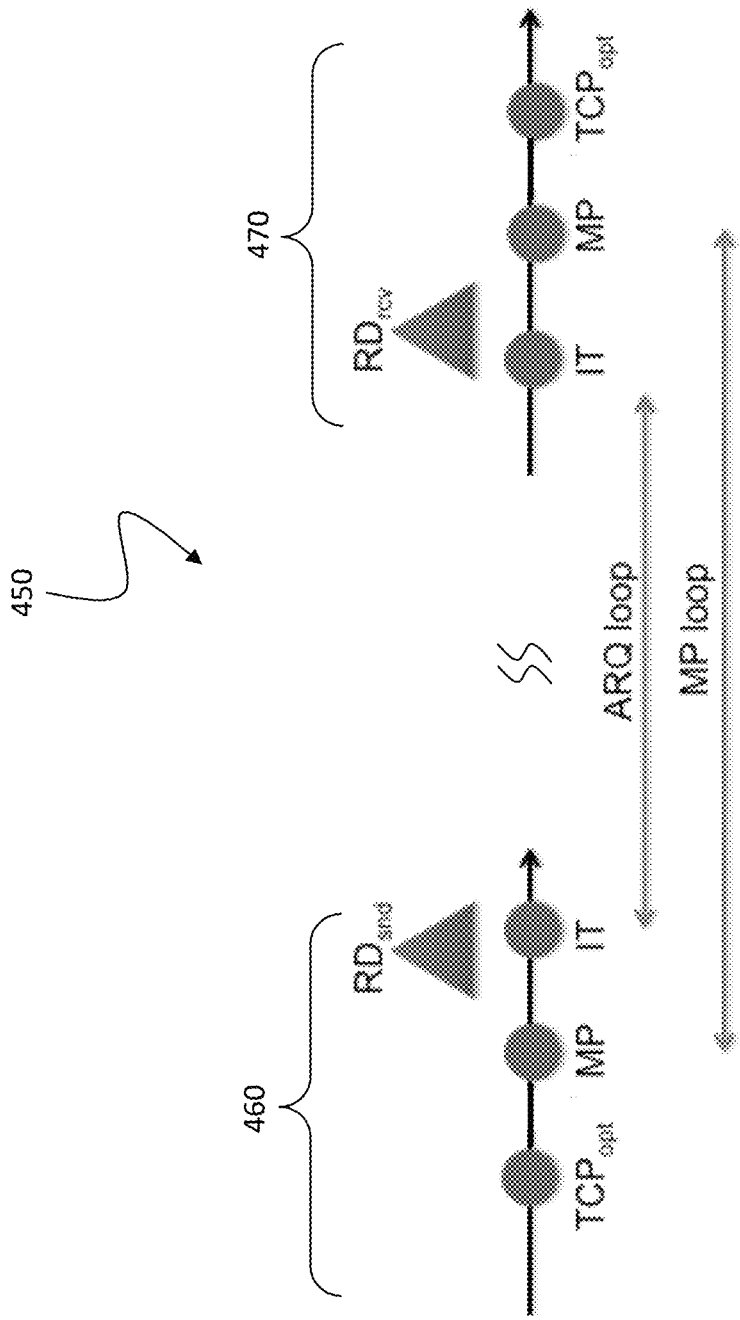
FIG. 11 is a schematic illustration showing a multipathing system architecture at the sender and receiver sides, respectively, that may be used in connection with the system described herein.

FIG. 11 is a schematic illustration showing a multipathing system architecture 450, e.g., RAPIDPath architecture, at the sender 460 and receiver 470 sides, respectively, that may be used in connection with the system described herein. Logic components are provided in connection with the multipathing appliances at both the sender site 460 and the receiver site 470. In connection with a RAPIDPath appliance, the components may include a TCP optimization component (TCPopt), a multipathing component (MP) and an intelligent transport component (IT). Most IP data networks rely on an automatic repeat request (ARQ) or retransmissions for recovering from losses. While ARQ is an efficient strategy from a bandwidth consumption standpoint, it is not effective in reducing the latency for data delivery in the presence of losses. The IT component may perform the functions in connection with an ARQ loop between the sender and receiver sites, 460, 470, and the MP component may control the MP loop. In the RAPIDpath architecture, the IT logic is implemented after the MP logic since IT is a path level function and MP is a connection level function. According to the system described herein, the multipathing appliances intelligently control a ratio of the packet rate transmissions (RDsnd and RDrcv) between multiple paths according to network conditions and connections of the paths.

The ARQ feedback loop incurs latency directly proportional to the round-trip time of the underlying path and hence can be inappropriate for traffic that is sensitive to delay. For protocols such as RAPIDpath and TCP that use losses as a sign of network congestion, ARQ does not provide any relief from congestion control when losses occur even if such losses are random and unrelated to congestion. As discussed in detail elsewhere herein, the system described herein provides for the use of FEC as an alternative strategy to ARQ for loss recovery that is latency and congestion control favorable at the cost of somewhat higher bandwidth consumption. The FEC techniques discussed herein may be used in tandem with ARQ. At a high level, additional information in the form of redundancy packets (say n–k packets) are sent for every k data packets sent. The loss of any n–k packets can then be tolerated without requiring any retransmissions. When there are more than n–k packet losses, an ARQ mechanism may need to be used. Such a technique is especially useful when WAN delays are large and loss-rates are non-negligible. Technologies related to FEC include approaches such as Reed-Solomon codes, rateless codes, and turbo codes, among others.

Figure 12:
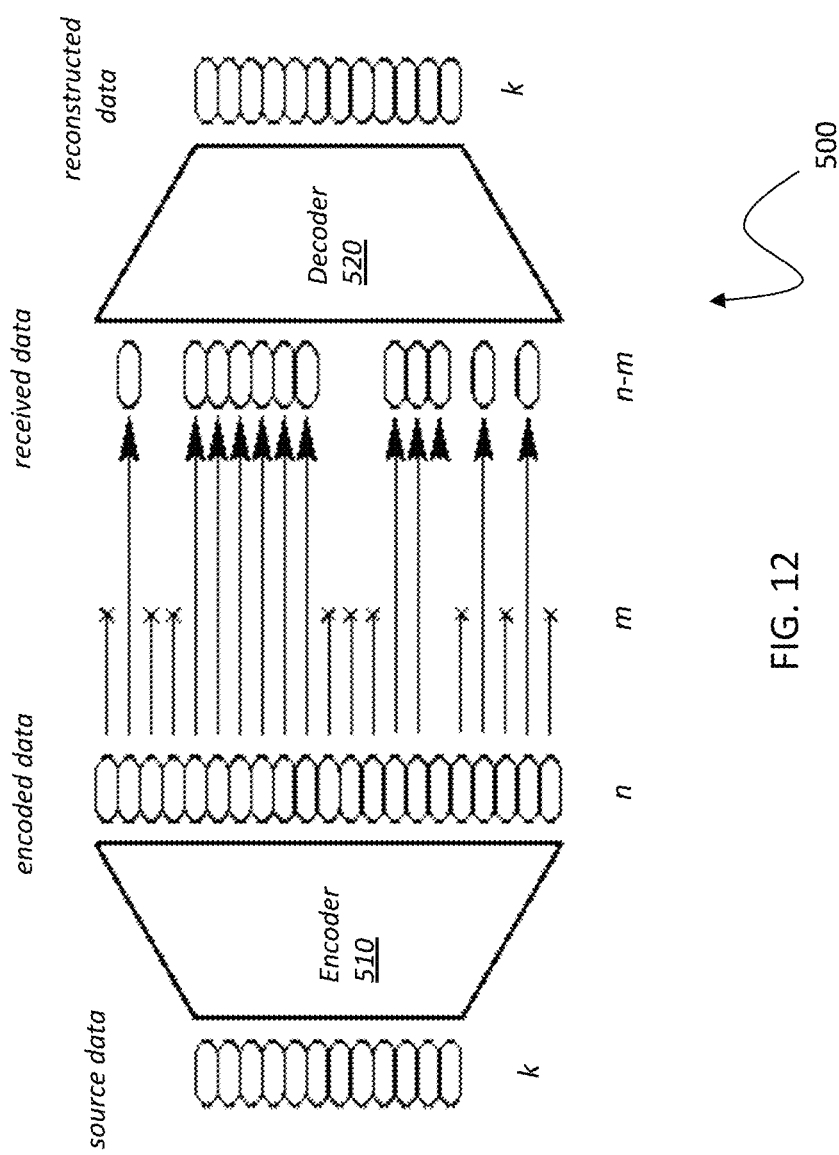
FIG. 12 is a schematic diagram showing FEC processing that may be used in connection with the system described herein.

FIG. 12 is a schematic diagram 500 showing FEC processing that may be used in connection with the system described herein. An example of the FEC processing may involve use of Reed Solomon (RS) coding. Reference is made to RFC 5510, "Reed-Solomon Forward Error Correction (FEC) Schemes," which is incorporated herein by reference. Although the system described herein is discussed principally in connection with RS codes, the system described herein may be used in connection with any other appropriate FEC codes and coding processes like that discussed elsewhere herein. RS codes are popular non-binary linear block codes. Given k data symbols, by adding n–k parity symbols, an RS code can correct up to (n–k)/2 random bit erasures. When RS codes are used to protect against packet losses, the encoding is done using specific techniques. Each packet stream is divided into blocks of packets with each block containing k packets. Consider each packet to be a set of X m-bit (e.g., 8 bits) symbols. The $u^{th}$ symbol of every packet in the block is then the input into an RS encoder 510 to create n symbols that respectively form the $u^{th}$ symbol in each of the corresponding encoded packets. Using an RS decoder 520, the destination will be able to decode the original k source packets as long as any k of the n packets are correctly received. Note that the decoder should know the specific locations of the k input packets in order to decode them correctly.

The RS encoder algorithm is as follows. For purposes of this discussion, consider a (n, k) RS code:

k packets at a time extracted from input stream;

ith byte from each of k packets extracted and fed into encoder;

for every k bytes, encoder creates n encoded bytes; and after entire byte sequence in k packets processed, n packets are transmitted.

The RS decoder algorithm is as follows. Consider m packet losses:

let m<=(n–k);

ith byte from each of (n–m) packets extracted and fed into decoder;

for every (n–m) bytes, decoder extracts k source bytes; and after entire byte sequence in (n–m) packets processed, k source packets are extracted.

There are several aspects of a typical data network environment that make RS codes suitable. Packets in a communication environment like the Internet either arrive at the destination or are dropped. The corruption of packets is rare, except perhaps in wireless environments, and is handled by lower layers. Hence, information transfer is subject only to erasures that RS codes are especially suited for. Moreover, packet erasures in the Internet tend to be bursty, and RS codes are inherently stronger for burst erasures. For a (n, k) RS code, the number of random bit errors that can be corrected is (n–k)/2 (e.g. 10 for (255,235)). However, the number of burst bit errors that can be corrected is m*((n–k)/2–1)+1 (e.g. 73 for (255, 235) and m=8).

The system described herein provides for the use of FEC in connection with mulithoming/multipathing functionality in a system leveraging multiple pathways and/or access circuits for packet delivery in a data network. In an appliance using multipathing, like a RAPIDpath appliance, sophisticated path characterization, scheduling, and sequencing algorithms are used to support path aggregation independent of the heterogeneity in path characteristics. It is especially useful in environments (such as the public Internet) where the direct path is either capacity constrained or is vulnerable to congestion problems. Technologies related to multipathing including channel bonding and IEEE 802.3ad link aggregation. Multihoming is a similar technique that leverages multiple access circuits that might exist to provide connectivity. While many network environments are equipped with multiple access circuits, these network environments typically are configured to use one of the circuits as the primary while the others are used only when the primary fails. Multihoming, on the other hand, enables the simultaneous use of all the available circuits without compromising on the high availability benefits.

Generally, FEC may be vulnerable to burst losses that could result in an un-decodable block. Specifically, if a pattern of losses results in more than n–k losses within an encoded block, the source data packets within that block cannot be recovered from. Independent of the degree of FEC redundancy and the underlying path loss rate, the probability of such unrecoverable events is non-zero and is referred to as the effective loss rate. The effective loss rate, or the loss rate exposed to the higher layers after FEC error correction has been applied, may need to be handled by alternate reliability mechanisms like ARQ. Moreover, the effective loss rate will also directly impact loss driven congestion control mechanisms such as TCP and RAPIDPath.

Thus, when multiple paths are available and packets within an encoded block can be striped over the multiple paths, the resultant diversity in loss profiles across the paths can provide considerable benefits in the FEC performance as measured by the effective loss rate. For example, consider two paths P1 and P2. Let both paths have a 1% loss rate. With no FEC, the effective loss rate is 1%. With a (6,4) RS code applied to a single path, the effective loss rate reduces to 0.553%. However, when the FEC blocks are striped over the two paths, the effective loss rate reduces to 0.148%, a 75% reduction. This improvement in the loss rate can have a profound impact on the congestion control performance of protocols such as TCP and RAPIDPath. Thus, it is desirable that algorithms that use FEC over multiple paths are explored and used when such paths are available.

According to the system described herein, adding FEC to a controlled multihoming/multipathing solution, such as RAPIDpath, may reduce the perceived loss rate, contribute to better performance in terms of delay and throughput, and provide for a more effective use of FEC. A multihoming/multipathing solution splits network traffic at the packet level according to network and connection conditions, as further discussed elsewhere herein. According to the system described herein FEC may be added to the packets in connection with transmission of the packets along the multiple paths and the level/amount of the FEC coding may be controlled based on the ratio of the rate at which the packets are split among the multiple paths.

Figure 13:
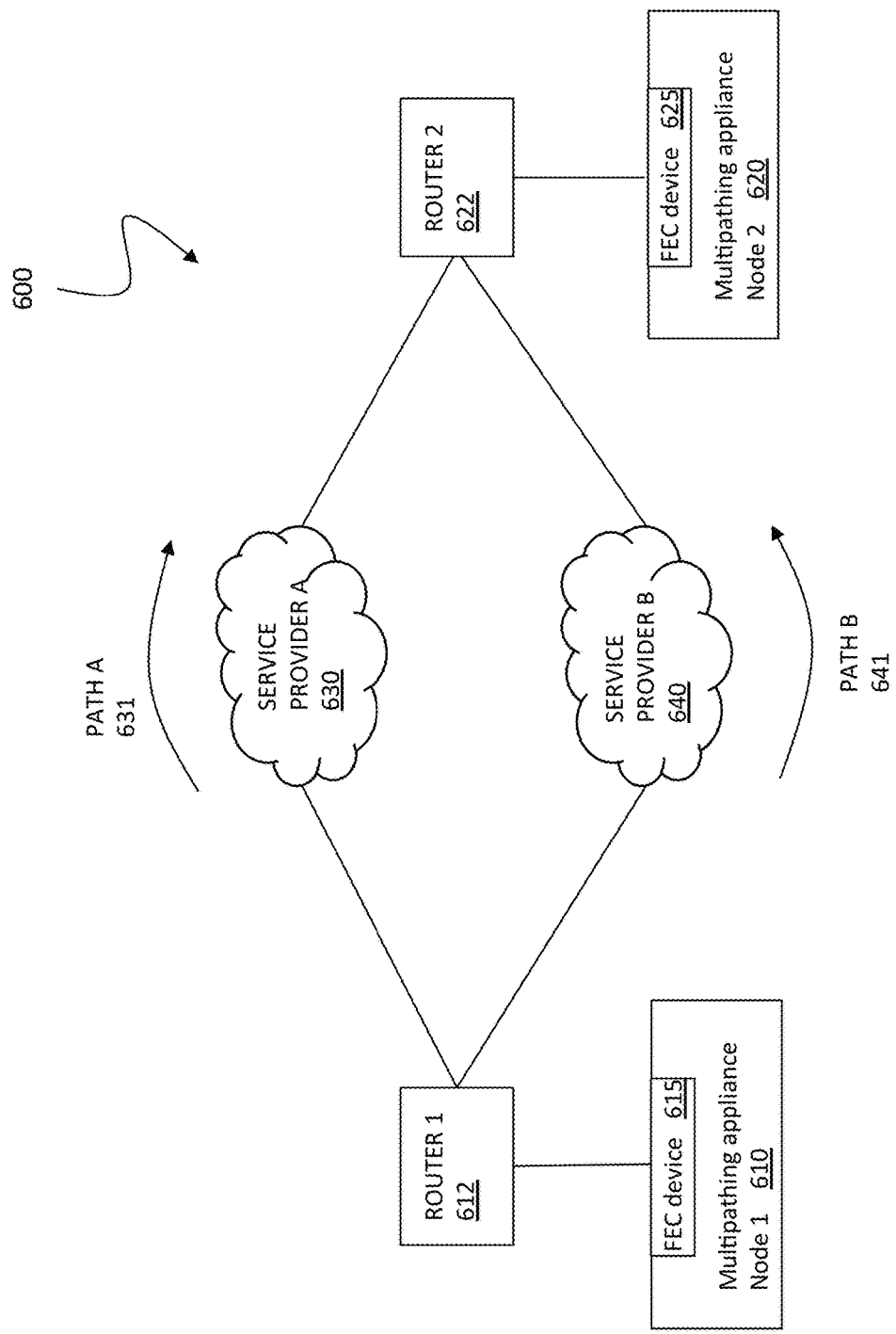
FIG. 13 is a schematic illustration showing a multipathing system using FEC according to an embodiment of the system described herein.

FIG. 13 is a schematic illustration showing a multipathing system 600 using FEC according to an embodiment of the system described herein. In an embodiment, the multipathing system 600 may be a RAPIDPath system architecture. The source and destination sites may include, as network nodes, a multipathing appliance, e.g., a RAPIDPath appliance, that is shown as multipathing appliance Node 1 610 and multipathing appliance Node 2 620. Two routers, Router 1 612 and Router 2 622, acts as routers/switches to transmit and receive data packets over the network according to the multipathing control provided by the multipathing appliances 610, 620. Two service providers, Service Provider A 630 and Service Provider B 640 as shown in connection with two illustrated paths, Path A 631 and Path B 641 through the network. Although two paths are shown, the system described herein may operate in connection with more than two paths.

The multipathing appliance 610 may include an FEC processing devices 615 and the multipathing appliance 620 may include an FEC processing devices 625. Although the FEC processing devices are shown as part of the multipathing appliances 610, 620, in other embodiments, the FEC processing devices 615, 625 may be separate devices. The FEC processing devices 615, 625 may control the FEC coding and decoding of data packets in connection with the sending and receiving of packets with FEC over the multipathing system architecture.

Figure 14:
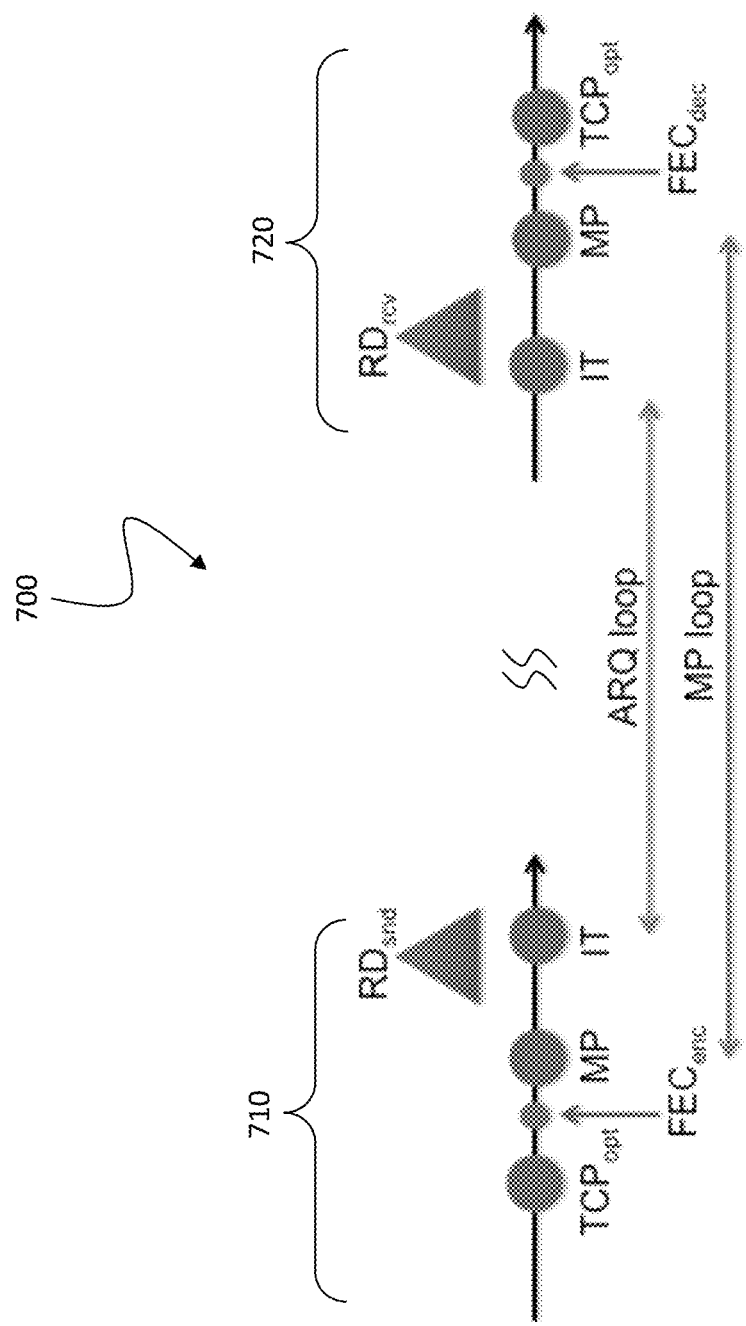
FIG. 14 is a schematic illustration showing insertion points for FEC in a multipathing system architecture at the sender and receiver sides, respectively.

FIG. 14 is a schematic illustration showing insertion points for FEC in a multipathing system architecture 700, e.g., RAPIDpath architecture, at the sender 710 and receiver 720 sides, respectively. The multipathing system architecture 700 may include similar components as discussed in connection with the multipathing system architecture 450, but in which FEC encoding (FECenc) and decoding (FECdec) points are illustrated in connection with the operational flow of the multipathing system architecture 700. According to the system described herein, a consideration in the use of FEC with an appliance, like a RAPIDpath appliance, is that there is always a non-zero finite probability that a block (of n bytes) is irrecoverable. This occurs when there are greater than (n–k) losses within the block. Thus, given the path with a loss rate (L), and a (n, k) RS code, there is a reduced but non-zero effective loss rate (Le).

In various embodiments, multiple strategies may be employed toward handling the selection of an appropriate (n, k) according to embodiments of the system described herein. The first strategy is to present an array of (n, k) options, and the customer is provided a configuration option to choose one from the array. In order to select the appropriate (n, k) intelligently, the customer may require visibility into the Le at a given setting. TABLE 1 shows a possible listing of (n, k) options along with the corresponding overheads.

TABLE 1

(n, k) options and overheads

| (n, k) | Overheads |
|--------|-----------|
| (6, 4) | 50% |
| (8, 6) | 33% |
| (5, 4) | 25% |
| (6, 5) | 20% |
| (11, 10) | 10% |
| (21, 20) | 5% |

The second alternative is to use an adaptive algorithm that automatically converges on the correct (n, k) option to use for a given target Le. Such an algorithm is presented below:
  maintain a target Le;
  set FEC-level to lowest degree (e.g. (21, 20) in above example);
  if observed Le larger than target Le, increase FEC-level to the next higher degree;
  if observed Le is smaller than target Le by a certain threshold, decrease FEC-level to next lower degree; and
  monitor Le, and repeat above actions periodically The advantage in the adaptive algorithm is that the customer is relieved of the burden to choose an appropriate (n, k). The advantage of the configurable option is that it is simple and is not fraught with the convergence latency and problems associated with the adaptive algorithm. Furthermore, the system described herein may be used in connection with blended algorithms that perform different degrees of FECs for different sections of the packet stream in order to achieve blended FEC-levels and to converge faster to the desired Le.

Additionally, given the transmission rate (ri) and loss rate (li) profiles of different paths, another solution is to take the following approach:
  choose n, the encoded block size, to be such that n is greater than X, the number of paths available; this would ensure that the maximum benefits because of the path diversity is leveraged;
  use systematic codes (first k packets in the encoded block the same as the k source data packets) for reducing the decoding complexity when no losses occur or when losses occur only in the redundancy packets; and
  ignore the loss-rates of the paths, and simply stripe the encoded block of n packets over the X paths based on the rate ratios between the paths. Such a design is defensible because the rate ri, in RAPIDpath, is in turn an inverse function of the loss rate li. Thus, striping based on ri's will implicitly take into account both the data rate available along the paths and their respective loss rates.

More sophisticated algorithms may be further used to explicitly tie the rate allocation to both ri and li, and to preferentially bias the transmission of the source data packets over the lowest loss rate paths.

FEC may be used in combination with ARQ in connection with an embodiment of the system described herein. When number of losses within an (n, k) encoded block is greater than n–k, retransmissions are required to help the FEC mechanism cope with those losses. Let m be the number of lost packets within the encoded block. Then, at least (m–n+k) of the lost packets need to be retransmitted. However, if there are any losses amongst the retransmitted packets, further retransmissions might be required. Alternatively, all m losses can be retransmitted. While this would involve more retransmissions than required, the retransmissions will naturally be protected by the FEC mechanism—essentially, only (m–n+k) of the m retransmissions need to get through to the receiver in order for the correct decoding to occur.

It is noted that in order for FEC to hide losses from RAPIDPath's congestion control and reliability algorithms, it has to exist within the ARQ loop (performed by the IT component). At the same time, in order for FEC to benefit from the diversity of multiple paths, FEC should exist outside the multipathing loop (performed by the MP component). However, the RAPIDpath architecture specifies that the IT logic is to be implemented after the MP logic, since IT is a path level function and MP is a connection level function. Hence, the integration of FEC with RAPIDpath has to address this problem.

A solution to the above problem is to modify the negative ACK (either duplicate or selective) behavior at the RAPID-path receiver. This solution is now discussed in detail.

Figure 15:
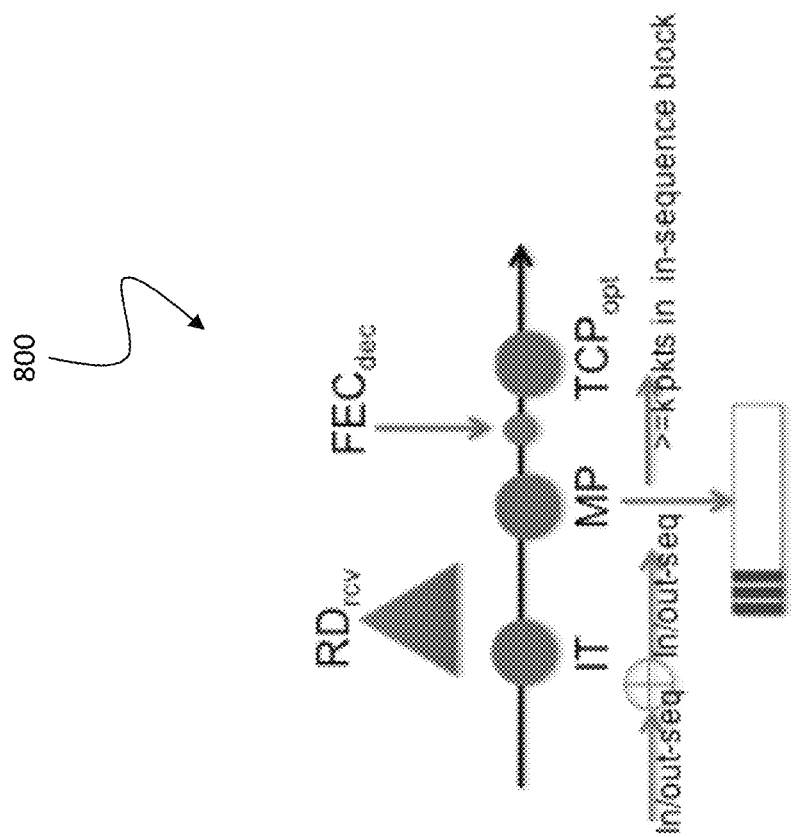
FIG. 15 is a schematic flow processing illustration showing a modified solution for data reception at a multipathing appliance with FEC.

FIG. 15 is a schematic flow processing illustration 800 showing a modified solution for data reception at a multipathing (RAPIDPath) appliance with FEC. The modified solution is outlined below:

IT receives in-sequence or out-of-sequence packet and hands it over to MP; since IT manages only virtual buffer, handing over out-of-sequence packets is default behavior;

MP queues packet in connection buffer;

when number of packets in next-in-sequence FEC block is greater than or equal to k, MP hands over packets to FECdec;

FECdec recreates original k source data packets; and

MP discards future packet arrivals for an already decoded block.

Thus, the only changed behavior on the receipt of a data packet at the receiver is for MP to dequeue and process packets even if some of the next-in-sequence packets are missing.

Figure 16:
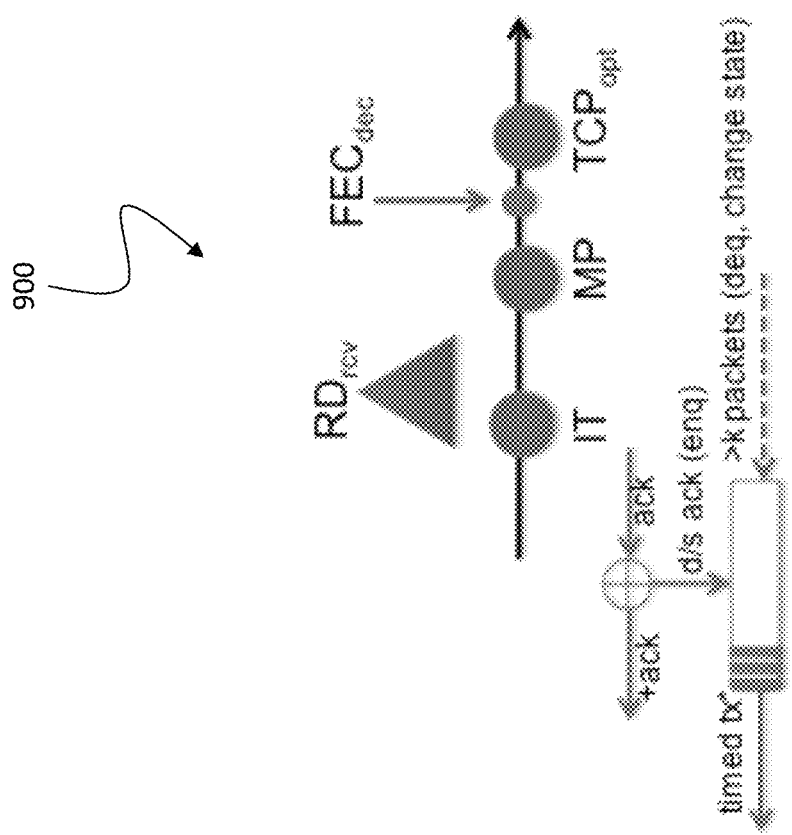
FIG. 16 is a schematic flow processing illustration showing modified behavior for ACK transmission at the multipathing appliance with FEC.

FIG. 16 is a schematic flow processing illustration 900 showing modified behavior for ACK transmission at the multipathing (RAPIDPath) appliance with FEC. The modified behavior for the ACK transmission is as follows:

IT sends out ACK:

If positive ACK, sent immediately;

If duplicate/selective ACK, added to delayed send queue+;

on finding greater than equal to k packets in any FEC block, MP removes d/s ACKs in delayed send queue, adds positive ACK, changes IT state appropriately+;

If k packets not received within delayed send timer*, d/s ACKs transmitted+;

retransmits sent without any additional protection—but will still benefit from original (n, k) encoding; Examples for (6, 4):

1-2 packet losses, no retransmissions;

p (>2) packet losses, retransmissions protected by (p, k–n+p) redundancy implicitly.

Thus, the ACK transmission behavior is modified such that MP has an opportunity to hide losses that are recoverable using FEC decoding. In this fashion, FEC can be deployed outside MP at the sender, but can still hide losses from IT.

Accordingly, integration of RAPIDpath and FEC may be summarized as follows:

allow configuration to choose from set of configurable (n, k) RS options;

perform systematic coding at FECenc before MP;

stripe k data packets and (n–k) redundancy packets over X paths based on ri's of individual paths;

retransmit at IT when d/s ACKs received;

MP header has FEC block id, and mapping of sequence numbers within block to paths; and use data reception and ACK transmission solutions described elsewhere herein.

Figure 17:
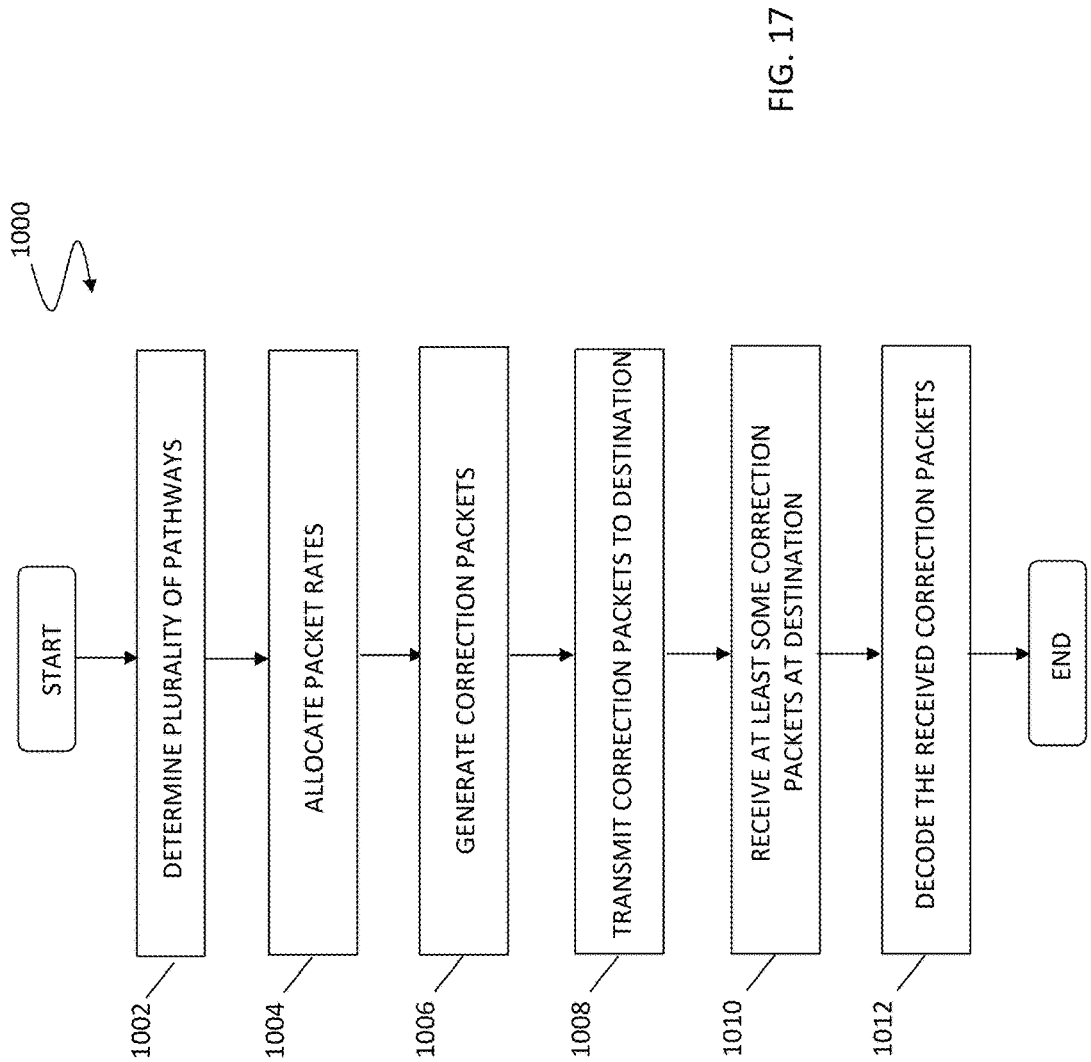
FIG. 17 is a flow diagram showing error correction processing according to an embodiment of the system described herein.

FIG. 17 is a flow diagram 1000 showing error correction processing according to an embodiment of the system described herein. At a step 1002, the processing includes determining a plurality of pathways in a data network environment for transmission of a plurality of data packets from a transmitting device to a destination device. After the step 1002, processing proceeds to a step 1004, where packet rates for the transmission of each of the plurality of data packets are allocated for each of the plurality of pathways. After the step 1004, processing proceeds to a step 1006 where correction packets corresponding to each of the plurality of data packets are generated for transmission to the destination device. The correction packets each include a level of forward error correction encoding. The level of forward error correction encoding for the correction packets depends on the packet rates for the transmission of the plurality of data packets for each of the plurality of pathways, as further discussed elsewhere herein.

After the step 1006, processing proceeds to a step 1008 where the correction packets are transmitted over the plurality of pathway to the destination device. After the step 1008, processing proceeds to a step 1010 where at least some of the correction packets are received at the destination device. After the step 1010, processing proceeds to a step 1012 where the correction packets received at the destination device are decoded to generate a copy of the plurality of packets initially transmitted from the transmitting device. After the step 1012, processing is complete.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include volatile memory and/or non-volatile memory, and may include, for example, a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for error correction processing, comprising:
    determining a plurality of pathways in a data network environment for transmission of a plurality of data packets from a transmitting device to a destination device;
    allocating packet rates for the transmission of each of the plurality of data packets for each of the plurality of pathways;
    generating correction packets corresponding to each of the plurality of data packets for transmission to the destination device, wherein the correction packets are generated with a first level of forward error correction encoding that corresponds to a difference between a number of transmitted data packets and a number of source data packets;
    determining packet transmission rates for different pathways of the plurality of pathways transmitting the correction packets to the destination device; and
    modifying the forward error correction encoding to a second level different from the first level based on the determined packet transmission rates for the different pathways, wherein transmitting the correction packets to the destination device over the different pathways of the plurality of pathways according to the first level or the second level of FEC encoding achieves blended FEC-levels for the correction packets transmitted to the destination device.

2. The method according to claim 1, further comprising:
    receiving at least some of the correction packets at the destination device; and
    decoding the at least some of the correction packets to generate the plurality of data packets.

3. The method according to claim 1, wherein the correction packets are transmitted to the destination device via a communications link that supports TCP/IP communication between the destination device and the transmitting device.

4. The method according to claim 1, further comprising:
    determining connection conditions between the transmitting device and the destination device for the plurality of pathways.

5. The method according to claim 1, wherein each of the transmitting device and the destination device include a multipathing appliance that performs the error correction processing.

6. The method according to claim 1, wherein allocating the packet rates for the transmission of each of the plurality of data packets for each of the plurality of pathways includes determining packet transmission rates and packet loss rates over the plurality of pathways.

7. The method according to claim 1, wherein the forward error correction encoding uses Reed Solomon coding.

8. The method according to claim 1, wherein determining the different levels of FEC encoding is based on determining packet transmission rates and packet loss rates over the plurality of pathways.

9. A non-transitory computer readable medium storing software for error correction processing, the software comprising:
    executable code that determines a plurality of pathways in a data network environment for transmission of a plurality of data packets from a transmitting device to a destination device;
    executable code that allocates packet rates for the transmission of each of the plurality of data packets for each of the plurality of pathways;
    executable code that generates correction packets corresponding to each of the plurality of data packets for transmission to the destination device, wherein the correction packets are generated with a first level of forward error correction encoding that corresponds to a difference between a number of transmitted data packets and a number of source data packets;
    executable code that determines packet transmission rates for different pathways of the plurality of pathways transmitting the correction packets to the destination device; and
    executable code that modifies the forward error correction encoding to a second level different from the first level based on the determined packet transmission rates for the different pathways, wherein the correction packets are transmitted to the destination device over the different pathways of the plurality of pathways according to the first level or the second level of FEC encoding in order to achieve blended FEC-levels for the correction packets transmitted to the destination device.

10. The non-transitory computer readable medium method according to claim 9, wherein the software further comprises:
    executable code that receives at least some of the correction packets at the destination device; and
    executable code that decodes the at least some of the correction packets to generate the plurality of data packets.

11. The non-transitory computer readable medium method according to claim 9, wherein the correction packets are transmitted to the destination device via a communications link that supports TCP/IP communication between the destination device and the transmitting device.

12. The non-transitory computer readable medium method according to claim 9, wherein the software further comprises:
    executable code that determines connection conditions between the transmitting device and the destination device for the plurality of pathways.

13. The non-transitory computer readable medium method according to claim 9, wherein the executable code that allocates the packet rates for the transmission of each of the plurality of data packets for each of the plurality of pathways includes executable code that determines packet transmission rates and packet loss rates over the plurality of pathways.

14. The non-transitory computer readable medium according to claim 9, wherein determining the different levels of FEC encoding is based on determining packet transmission rates and packet loss rates over the plurality of pathways.

15. A system for error correction processing, comprising:
    a device that is coupled to a network, the device including a processor and a computer-readable medium that stores software executable by the processor, wherein the software includes:

executable code that determines a plurality of pathways in a data network environment for transmission of a plurality of data packets from a transmitting device to a destination device;

executable code that allocates packet rates for the transmission of each of the plurality of data packets for each of the plurality of pathways;

executable code that generates correction packets corresponding to each of the plurality of data packets for transmission to the destination device, wherein the correction packets are generated with a first level of forward error correction encoding that corresponds to a difference between a number of transmitted data packets and a number of source data packets;

executable code that determines packet transmission rates for different pathways of the plurality of pathways transmitting the correction packets to the destination device; and executable code that modifies the forward error correction encoding to a second level different from the first level based on the determined packet transmission rates for the different pathways, wherein the correction packets are transmitted to the destination device over the different pathways of the plurality of pathways according to the first level or the second level of FEC encoding in order to achieve blended FEC-levels for the correction packets transmitted to the destination device.

16. The system according to claim 15, wherein the software further comprises:

executable code that receives at least some of the correction packets at the destination device; and executable code that decodes the at least some of the correction packets to generate the plurality of data packets.

17. The system according to claim 15, wherein the correction packets are transmitted to the destination device via a communications link that supports TCP/IP communication between the destination device and the transmitting device.

18. The system according to claim 15, wherein the software further comprises:

executable code that determines connection conditions between the transmitting device and the destination device for the plurality of pathways.

19. The system according to claim 15, wherein the executable code that allocates the packet rates for the transmission of each of the plurality of data packets for each of the plurality of pathways includes executable code that determines packet transmission rates and packet loss rates over the plurality of pathways.

20. The system according to claim 15, wherein determining the different levels of FEC encoding is based on determining packet transmission rates and packet loss rates over the plurality of pathways.

* * * * *